(12) United States Patent
Kim et al.

(10) Patent No.: US 12,527,171 B2
(45) Date of Patent: Jan. 13, 2026

(54) DISPLAY PANEL AND DISPLAY APPARATUS INCLUDING THE SAME

(71) Applicant: LG Display Co., Ltd., Seoul (KR)

(72) Inventors: Jae Sung Kim, Paju-si (KR); Wang Geun Lee, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 18/787,556

(22) Filed: Jul. 29, 2024

(65) Prior Publication Data

US 2025/0185473 A1   Jun. 5, 2025

(30) Foreign Application Priority Data

Dec. 5, 2023   (KR) .................. 10-2023-0174465

(51) Int. Cl.
*G09G 3/3233* (2016.01)
*H10K 59/121* (2023.01)
*H10K 59/126* (2023.01)

(52) U.S. Cl.
CPC ......... *H10K 59/126* (2023.02); *G09G 3/3233* (2013.01); *H10K 59/1213* (2023.02); *G09G 2300/0819* (2013.01); *G09G 2300/0842* (2013.01); *G09G 2300/0861* (2013.01); *G09G 2310/0289* (2013.01); *G09G 2310/08* (2013.01); *G09G 2320/0238* (2013.01); *G09G 2320/066* (2013.01); *G09G 2330/021* (2013.01); *G09G 2340/0435* (2013.01)

(58) Field of Classification Search
CPC .... G09G 3/32; G09G 3/3233; H10D 30/0321; H10D 86/40; H10K 59/1213; H10K 59/126
See application file for complete search history.

(56) References Cited

U.S. PATENT DOCUMENTS

| | | | |
|---|---|---|---|
| 2018/0157086 A1* | 6/2018 | Cho ................... | G02F 1/13362 |
| 2024/0030399 A1* | 1/2024 | Akimoto ............. | H10D 86/60 |
| 2024/0038151 A1* | 2/2024 | Li ....................... | G09G 3/32 |

* cited by examiner

*Primary Examiner* — Kevin M Nguyen
(74) *Attorney, Agent, or Firm* — Fenwick & West LLP

(57) ABSTRACT

A display apparatus may include a first pixel area including a first plurality of pixels, and a second pixel area including a second plurality of pixels. A pixel circuit for each of the first plurality of pixels and the second plurality of pixels may include a first plurality of transistors having an oxide semiconductor layer, and a second plurality of transistors having a polysilicon semiconductor layer. A shielding layer may be disposed under a portion of the second plurality of transistors having the polysilicon semiconductor layer.

18 Claims, 13 Drawing Sheets

DISPLAY PANEL AND DISPLAY APPARATUS INCLUDING THE SAME

CROSS-REFERENCE TO RELATED APPLICATION

This application claims the priority from Republic of Korea Patent Application No. 10-2023-0174465, filed on Dec. 5, 2023, which is hereby incorporated by reference in its entirety.

BACKGROUND

Field

The present disclosure relates to a display panel and a display apparatus including the same.

Description of Related Art

In recent years, a variety of optical devices have been added to mobile apparatuses. The optical devices may include sensors or lighting fixtures necessary to support multi-media features or to perform biometrics. For example, cameras are built into smartphones by default, and the resolution of the cameras is increasing to the level of traditional digital cameras.

SUMMARY

The cameras in the front of the smartphones limits the design of a screen and makes it difficult to design the screen. Screen designs with notches or punch holes have been adopted in the smartphones to reduce the space taken up by the cameras, but the cameras still limit the size of the screen, making it impossible to realize a full-screen display.

It may be considered to place the optical devices under the display panel so that they overlap with the pixels on the display panel, but light transmittance may be reduced due to pixels, and the driving characteristics of the pixels may be degraded by the light in the optical devices.

The present disclosure provides a display panel capable of securing light transmittance light emanating from an optical device and realizing a full-screen display without deteriorating driving characteristics of the pixels, and a display apparatus including the same.

Additional features and advantages of the disclosure will be set forth in the description which follows and in part will be apparent from the description, or may be learned by practice of the disclosure. Other advantages of the present disclosure will be realized and attained by the structure particularly pointed out in the written description and claims hereof as well as the appended drawings.

A display panel according to one or more embodiments of the present disclosure may include a first pixel area including a first plurality of pixels and a second pixel area including a second plurality of pixels. A pixel circuit for each of the first plurality of pixels and the second plurality of pixels may include a first plurality of transistors having an oxide semiconductor layer and a second plurality of transistors having a polysilicon semiconductor layer. A shielding layer may be disposed under a portion of the second plurality of transistors having the polysilicon semiconductor layer.

According to one or more embodiments of the present disclosure, a display apparatus may include a display panel having a first pixel area with a first plurality of pixels and a second pixel area with a second plurality of pixels, the display panel configured to display an image, and an optical device under the display panel, the optical device overlapping the second pixel area. A pixel circuit for each pixel of at least one of the first plurality of pixels or the second plurality of pixels may include a first plurality of transistors having an oxide semiconductor layer, and a second plurality of transistors having a polysilicon semiconductor layer. A shielding layer may be under a portion of the second plurality of transistors having the polysilicon semiconductor layer.

A display apparatus according to one or more embodiments of the present disclosure may include an optical device under the display panel, the optical device overlapping the second pixel area.

According to one or more embodiments of the present disclosure, the optical device is under the display panel to overlap the display area on which an image is displayed, thereby realizing a full-screen display and reducing the power consumption of the display apparatus.

According to one or more embodiments of the present disclosure, it is possible to improve image sensing performance and facial recognition performance of the optical device by increasing a transmittance of the display panel to infrared rays emitted from the optical device and infrared light directed to the optical device and configuring a shielding layer for blocking infrared rays in a transistor whose current-voltage characteristic change is sensitively changed upon exposure to infrared rays.

According to one or more embodiments of the present disclosure, it is possible to prevent an increase in black luminance in the display panel having a structure vulnerable to infrared exposure.

It is to be understood that both the foregoing general description and the following detailed description of the present disclosure are exemplary and explanatory and are intended to provide further explanation of the disclosure as claimed.

BRIEF DESCRIPTION OF THE DRAWINGS

The accompanying drawings, which are included to provide a further understanding of the disclosure, and incorporated in and constitute a part of the disclosure, illustrate embodiments of the disclosure and together with the description serve to explain the principle of the disclosure.

Figure 1:
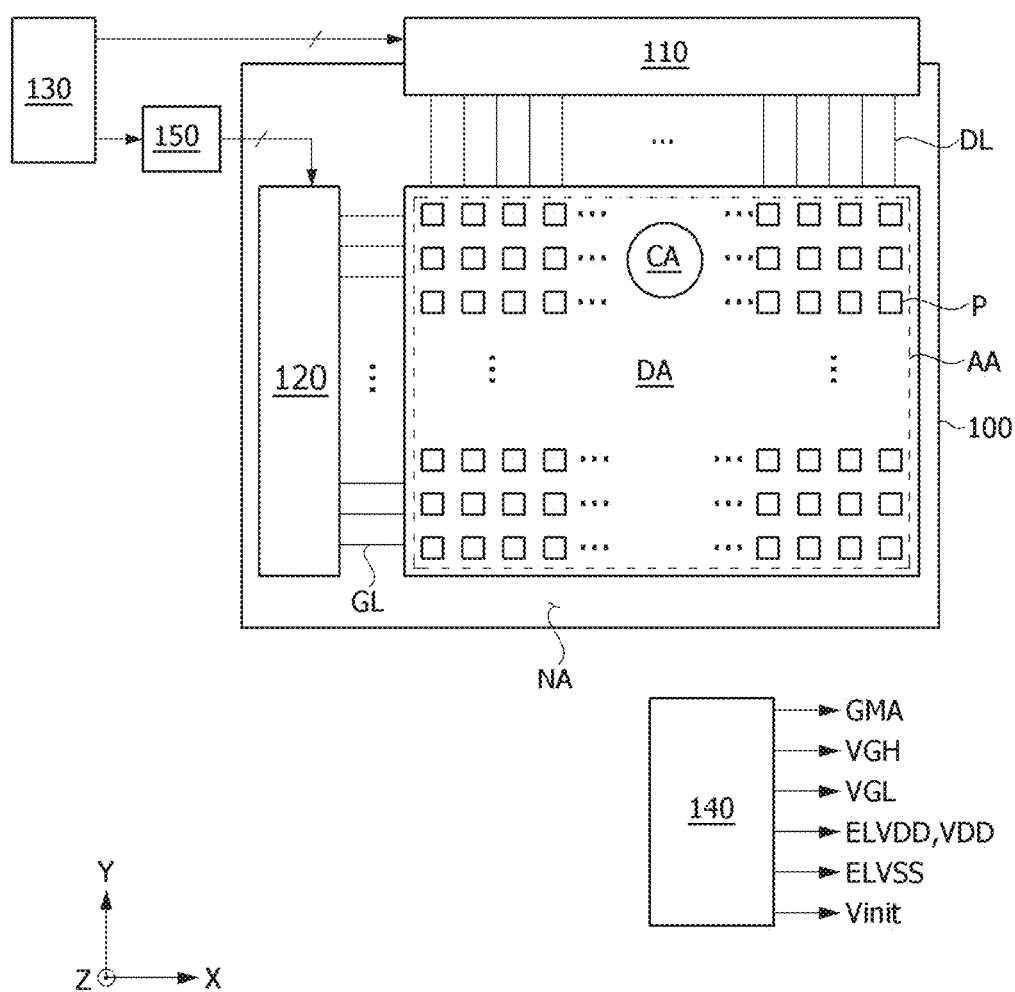
FIG. 1 is a block diagram illustrating a display apparatus according to one or more embodiments of the present disclosure.

Throughout the drawings and the detailed description, unless otherwise described, the same drawing reference numerals should be understood to refer to the same elements, features, and structures. The sizes, lengths, and thicknesses of layers, regions and elements, and depiction thereof may be exaggerated for clarity, illustration, and/or convenience.

DETAILED DESCRIPTION

Reference is now made in detail to embodiments of the present disclosure, examples of which may be illustrated in the accompanying drawings. In the following description, when a detailed description of well-known methods, functions or configurations may unnecessarily obscure embodiments of the present disclosure, the detailed description thereof may be omitted for brevity. The progression of processing steps and/or operations described is an example; however, the sequence of steps and/or operations is not limited to that set forth herein and may be changed, with the exception of steps and/or operations necessarily occurring in a particular order.

Unless stated otherwise, like reference numerals may refer to like elements throughout even when they are shown in different drawings. Unless stated otherwise, the same reference numerals may be used to refer to the same or substantially the same elements throughout the specification and the drawings. In one or more embodiments, identical elements (or elements with identical names) in different drawings may have the same or substantially the same functions and properties unless stated otherwise. Names of the respective elements used in the following explanations are selected only for convenience and may be thus different from those used in actual products.

Advantages and features of the present disclosure, and implementation methods thereof, are clarified through the embodiments described with reference to the accompanying drawings. The present disclosure may, however, be embodied in different forms and should not be construed as limited to the embodiments set forth herein. Rather, these embodiments are examples and are provided so that this disclosure may be thorough and complete to assist those skilled in the art to understand the inventive concepts without limiting the protected scope of the present disclosure.

The shapes, sizes, areas, widths, heights, thicknesses, ratios, angles, numbers, the number of elements, and the like illustrated in the drawings for describing embodiments of the present disclosure are merely examples, and thus, the present disclosure is not limited to the illustrated details. When the term "comprise," "have," "include," "contain," "constitute," "made of," "formed of," "composed of," or the like is used, one or more elements (e.g., layers, films, regions, components, sections, members, parts, regions, areas, portions, steps, operations, and/or the like) may be added unless a term such as "only" or the like is used. The terms used in the present disclosure are merely used to describe particular embodiments, and are not intended to limit the scope of the present disclosure. The terms used herein are merely used to describe example embodiments, and are not intended to limit the scope of the present disclosure. The terms of a singular form may include plural forms unless the context clearly indicates otherwise." The word "exemplary" is used to mean serving as an example or illustration. An embodiment may be one or more example embodiments. Embodiments are example embodiments. Any implementation described herein as an "example" or "embodiment" is not necessarily to be construed as preferred or advantageous over other implementations.

In one or more embodiments, an element, feature, or corresponding information (e.g., a level, range, dimension, size, or the like) is construed as including an error or tolerance range even where no explicit description of such an error or tolerance range is provided. An error or tolerance range may be caused by various factors (e.g., process factors, internal or external impact, noise, or the like). Further, the term "may" encompass all the meanings of the term "may."

In describing a positional relationship, where the positional relationship between two parts is described, for example, using "on," "over," "under," "above," "below," "beneath," "near," "close to," "adjacent to," "beside," "next to," or the like, one or more other parts may be located between the two parts unless a more limiting term, such as "immediate(ly)," "direct(ly)," or "close (ly)," is used. For example, when a structure is described as being positioned "on," "over," "under," "above," "below," "beneath," "near," "close to," "adjacent to," "beside," or "next to" another structure, this description should be construed as including a case in which the structures contact each other as well as a case in which one or more additional structures are disposed or interposed therebetween. Furthermore, the terms "front," "rear," "back," "left," "right," "top," "bottom," "downward," "upward," "upper," "lower," "up," "down," "column," "row," "vertical," "horizontal," and the like refer to an arbitrary frame of reference.

In describing a temporal relationship, when the temporal order is described as, for example, "after," "subsequent," "next," "before," "preceding," "prior to," or the like, a case that is not consecutive or not sequential may be included unless a more limiting term, such as "just," "immediate (ly)," or "direct (ly)," is used.

It is understood that, although the term "first," "second," or the like may be used herein to describe various elements (e.g., layers, films, regions, components, sections, members, parts, regions, areas, portions, steps, operations, and/or the like), these elements should not be limited by these terms. These terms are only used to distinguish one element from another. For example, a first element could be a second element, and, similarly, a second element could be a first element, without departing from the scope of the present disclosure. Furthermore, the first element, the second element, and the like may be arbitrarily named according to the convenience of those skilled in the art without departing from the scope of the present disclosure. The terms "first,"

"second," and the like may be used to distinguish components from each other, but the functions or structures of the components are not limited by ordinal numbers or component names in front of the components.

In describing elements of the present disclosure, the terms "first," "second," "A," "B," "(a)," "(b)," or the like may be used. These terms are intended to identify the corresponding element(s) from the other element(s), and these terms are not used to define the essence, basis, order, or number of the elements.

For the expression that an element (e.g., layer, film, region, component, section, or the like) is "connected," "coupled," "attached," "adhered," or the like to another element, the element may not only be directly connected, coupled, attached, adhered, or the like to another element, but also be indirectly connected, coupled, attached, adhered, or the like to another element with one or more intervening elements disposed or interposed between the elements, unless otherwise specified.

For the expression that an element (e.g., layer, film, region, component, section, or the like) "contacts," "overlaps," or the like with another element, the element may not only directly contact, overlap, or the like with the another element, but also indirectly contact, overlap, or the like with another element with one or more intervening elements disposed or interposed between the elements or layers, unless otherwise specified.

The terms such as a "line" or "direction" should not be interpreted only based on a geometrical relationship in which the respective lines or directions are parallel or perpendicular to each other, and may be meant as lines or directions having wider directivities within the range within which the components of the present disclosure may operate functionally.

The term "at least one" should be understood as including any and all combinations of one or more of the associated listed items. For example, each of the phrases "at least one of a first item, a second item, or a third item" and "at least one of a first item, a second item, and a third item," may represent (i) a combination of two or more of the first item, the second item, and the third item and (ii) only one of the first item, the second item, and the third item.

The expression of a first element, a second elements "and/or" a third element should be understood to encompass one of the first, second, and third elements, as well as any or all combinations of the first, second and third elements. By way of example, A, B and/or C encompass only A; only B; only C; any of A, B, and C (e.g., A, B, or C; some combination of A, B, and C (e.g., A and B; A and C; or B and C); and all of A, B, and C. Furthermore, an expression "A/B" may be understood as A and/or B. For example, an expression "A/B" can refer to only A; only B; A or B; or A and B.

In one or more embodiments, the terms "between" and "among" may be used interchangeably simply for convenience unless stated otherwise. For example, an expression "between a plurality of elements" may be understood as among a plurality of elements. In another example, an expression "among a plurality of elements" may be understood as between a plurality of elements. In one or more examples, the number of elements may be two. In one or more examples, the number of elements may be more than two. Furthermore, when an element (e.g., layer, film, region, component, sections, or the like) is referred to as being "between" at least two elements, the element may be the only element between the at least two elements, or one or more intervening elements may also be present.

In one or more embodiments, the phrases "each other" and "one another" may be used interchangeably simply for convenience unless stated otherwise. For example, an expression "different from each other" may be understood as being different from one another. In another example, an expression "different from one another" may be understood as being different from each other. In one or more examples, the number of elements involved in the foregoing expression may be two. In one or more examples, the number of elements involved in the foregoing expression may be more than two.

In one or more embodiments, the phrases "one or more among" and "one or more of" may be used interchangeably simply for convenience unless stated otherwise.

The term "or" means "inclusive or" rather than "exclusive or." For example, unless otherwise stated or clear from the context, the expression that "x uses a or b" means any one of natural inclusive permutations. For example, "a or b" may mean "a," "b," or "a and b." For example, "a, b or c" may mean "a," "b," "c," "a and b," "b and c," "a and c," or "a, b and c."

Features of various embodiments of the present disclosure may be partially or entirely coupled to or combined with each other, may be technically associated with each other, or may be operated, linked or driven together in various ways. Embodiments of the present disclosure may be implemented or carried out independently from each other, or may be implemented or carried out together in a co-dependent or related relationship. In one or more embodiments, the components of each apparatus according to various aspects of the present disclosure are operatively coupled and configured.

Unless otherwise defined, the terms (including technical and scientific terms) used herein have the same meaning as commonly understood by one of ordinary skill in the art to which embodiments belong. It is further understood that terms, such as those defined in commonly used dictionaries, should be interpreted as having a meaning that is, for example, consistent with their meaning in the context of the relevant art and should not be interpreted in an idealized or overly formal sense unless expressly defined otherwise herein.

The terms used herein have been selected as being general in the related technical field. However, there may be other terms than the terms depending on the development and/or change of technology, convention, preference of technicians, etc. Therefore, the terms used herein should not be understood as limiting technical ideas, but should be understood as examples of the terms for illustrating embodiments.

Further, in a specific case, a term may be arbitrarily selected by the applicant, and in this case, the detailed meaning thereof is described herein. Therefore, the terms used herein should be understood based on not only simply the name of the terms, but also the meaning of the terms and the contents thereof.

"X-axis direction," "Y-axis direction," and "Z-axis direction," should not be construed by a geometric relation only of a mutual vertical relation and may have broader directionality within the range that elements of the present disclosure may act functionally.

In the following description, various embodiments of the present disclosure are described in detail with reference to the accompanying drawings. With respect to reference numerals to elements of each of the drawings, the same elements may be illustrated in other drawings, and like reference numerals may refer to like elements unless stated otherwise. In addition, for convenience of description, a scale, dimension, size, and thickness of each of the elements illustrated in the accompanying drawings may be different from an actual scale, dimension, size, and thickness, and thus, embodiments of the present disclosure are not limited to a scale, dimension, size, and thickness illustrated in the drawings.

A pixel circuit and a gate drive circuit of the display apparatus may include a plurality of transistors. The transistor may be implemented as a thin film transistor (TFT). The transistors may be implemented as an oxide thin film transistor (TFT) including an oxide semiconductor, a low temperature poly silicon TFT (LTPS TFT) including a low temperature poly silicon, and the like. The transistors may be implemented as p-channel TFT or n-channel TFT.

For example, the oxide semiconductor material may include at least one or more of an IGZO (InGaZnO)-based oxide semiconductor material, an IZO (InZnO)-based oxide semiconductor material, an IGZTO (InGaZnSnO)-based oxide semiconductor material, an ITZO (InSnZnO)-based oxide semiconductor material, a FIZO (FeInZnO)-based oxide semiconductor material, a ZnO-based oxide semiconductor material, a SIZO (SiInZnO)-based oxide semiconductor material, or a ZnON (Zn-Oxynitride)-based oxide semiconductor material, but embodiments of the present disclosure are not limited thereto.

A transistor is a three-terminal element including a gate, a source, and a drain. The source is an electrode that supplies carriers to the transistor. In the transistor, carriers start to flow from the source. The drain is an electrode in which carriers go outside in the transistor. In a transistor, carriers flow from the source to the drain. In the case of an n-channel transistor, since carriers are electrons, a source voltage is a voltage lower than a drain voltage such that electrons may flow from the source to the drain. The n-channel transistor has a direction of a current flowing from the drain to the source. In the case of a p-channel transistor (p-channel metal-oxide semiconductor (PMOS)), since carriers are holes, a source voltage is higher than a drain voltage such that holes may flow from the source to the drain. In the p-channel transistor, since holes flow from the source to the drain, current flows from the source to the drain. It should be noted that a source and a drain of a transistor are not fixed. For example, a source and a drain may be changed according to an applied voltage. Therefore, embodiments of the present disclosure are not limited by a source and a drain of a transistor. In the following description, a source and a drain of a transistor will be referred to as a first electrode and a second electrode.

A gate signal may swing between a gate-on voltage and a gate-off voltage. A transistor may be turned on in response to a gate-on voltage and may be turned off in response to a gate-off voltage. In the case of an n-channel transistor, the gate-on voltage may be a gate high voltage VGH, and the gate-off voltage may be a gate low voltage VGL. In the case of a p-channel transistor, the gate-on voltage may be the gate low voltage VGL, and the gate-off voltage may be the gate high voltage VGH.

Hereinafter, various embodiments of the present disclosure will be described in detail with reference to the accompanying drawings.

Figure 2:
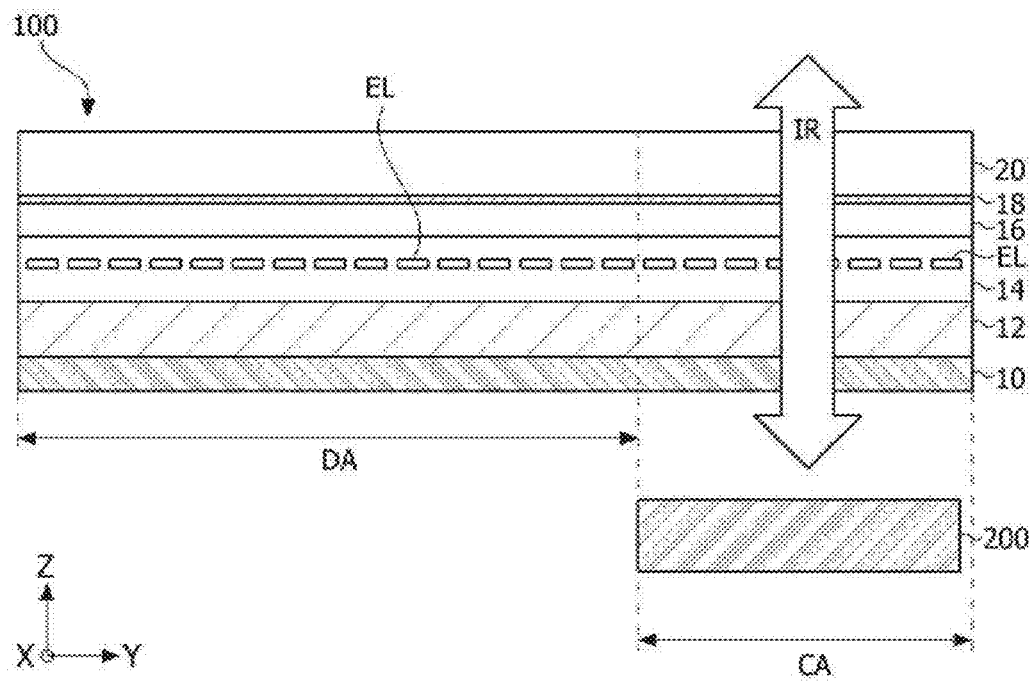
FIG. 2 is a cross-sectional view illustrating an example of a cross-sectional structure of the display panel shown in FIG. 1 according to one or more embodiments of the present disclosure.
Figure 3:
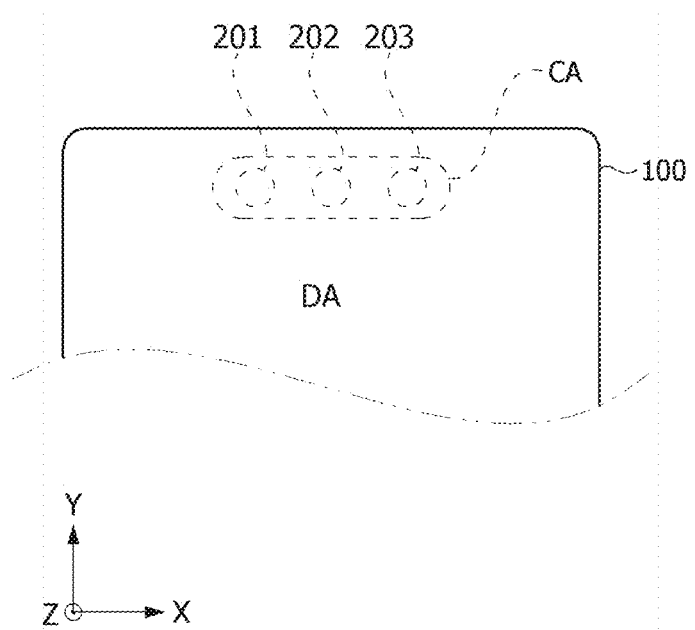
FIG. 3 illustrates a configuration of an optical device according to one or more embodiments of the present disclosure.

FIG. 1 is a block diagram illustrating a display apparatus according to one or more embodiments of the present disclosure. FIG. 2 is a cross-sectional view illustrating an example of a cross-sectional structure of the display panel shown in FIG. 1 according to one or more embodiments of the present disclosure. FIG. 3 illustrates a configuration of an optical device according to one or more embodiments of the present disclosure.

Referring to FIGS. 1 to 3, a display apparatus may include a display panel 100, display panel driving circuit configured to write a pixel data of an input image to pixels P of the display panel 100, and an optical device 200 disposed under the display panel 100.

The display panel 100 may include a display area AA that displays the input image on a screen. The display area AA may be divided into or include a first pixel area DA and a second pixel area CA. Most of image information may be displayed in the first pixel area DA. Each of the first pixel area DA and the second pixel area CA may include a plurality of pixels P to display the input image.

The pixels in the second pixel area CA may have a lower pixel density or a lower pixel per inch (PPI) than the pixels in the first pixel area DA, but embodiments of the present disclosure are not limited thereto. For example, at least a portion of the second pixel area CA may have pixels P disposed therein at the same pixel density as the first pixel area DA. Further, although the PPI of the first and second pixel areas DA and CA may be the same, the resolution of the pixels driven in the second pixel area CA may be less than the resolution of the first pixel area DA.

At least a portion of the second pixel area CA may be a transflective region including a plurality of light transmitting portions without a light-blocking medium. The light transmitting portions may be disposed between sub-pixels. When the pixel density of the second pixel area CA is smaller than the pixel density of the first pixel area DA, the light transmitting portions in the second pixel area CA may be larger.

A substrate of the display panel 100 may be, but is not limited to, a plastic substrate, a thin glass substrate, or a metal substrate. The display panel 100 may be a rectangular shaped panel having a length in the X-axis direction (or first direction), a width in the Y-axis direction (or second direction), and a thickness in the Z-axis direction (or third direction), but is not limited thereto. For example, at least a portion of the display panel 100 may have an outer portion having a curved shape.

The display panel 100 may include wires such as a plurality of data lines DL, a plurality of gate lines GL crossing the data lines DL, and a plurality of power lines. The pixels P in the display area AA are connected to the data lines DL, the gate lines GL, and the power lines. The power lines may be commonly connected to the pixels P and supply a constant voltage required configured to drive the pixels P to the pixels P. The power lines may be implemented as long stripes of wires along either the first or second direction, or may be implemented in the display panel 100 as mesh wires in which the wires in the first direction and the wires in the second direction are electrically connected.

Each of the pixels P in the first pixel area DA and the second pixel area CA may be divided into or may include red sub-pixels, green sub-pixels, and blue sub-pixels for color implementation. Each of the pixels may further include a white sub-pixel. Each of the sub-pixels may include a pixel circuit configured to drive a light-emitting element. Each of the pixel circuits may be connected to the data lines, the gate lines, and the power lines. In the following, the term "pixel" may be used interchangeably with the "sub-pixel".

The pixels P may be disposed as real color pixels and pentile pixels, but embodiments of the present disclosure are not limited thereto. A pentile pixel may implement a higher resolution than a real color pixel by driving two sub-pixels of different colors as one pixel P by a predefined pixel rendering algorithm. The pixel rendering algorithm may compensate for insufficient color expression in each pixel P with the color of the light emitted by its adjacent pixel P.

The display panel 100 may include, but is not limited to, a circuit layer 12, a light-emitting element layer 14, an encapsulation layer 16, a touch sensor layer 18, and a cover glass 20 disposed on the substrate 10 as illustrated in FIG. 2.

Referring to FIGS. 1 and 2, the circuit layer 12 may include the pixel circuit connected to the wires such as the data lines DL, the gate lines GL, the power lines, and a circuit of the gate driver 120. The wires and circuit elements in the circuit layer 12 may include a plurality of insulating layers, two or more metal layers separated with the insulating layer therebetween, and an active layer (or semiconductor layer) including a semiconductor material.

The light-emitting element layer 14 may include a plurality of light-emitting elements EL driven by the pixel circuit. The light-emitting elements may be organic light-emitting diodes (OLED) or inorganic light-emitting elements such as micro light-emitting diodes, but embodiments of the present disclosure are not limited thereto. For example, the light-emitting element layer 14 may include electrodes of the light-emitting element EL, as illustrated in FIG. 2, and a light emission layer interposed between the electrodes. The light-emitting elements EL may include a red light-emitting element, a green light-emitting element, and a blue light-emitting element, but is not limited to. For example, the light-emitting element layer 14 may further include a white light-emitting element and a color filter. The light-emitting elements EL in the light-emitting element layer 14 may be covered by a multi-protective layer including an organic film and an inorganic film.

The encapsulation layer 16 may cover the light-emitting element layer 14 to seal the circuit layer 12 and the light-emitting element layer 14. The encapsulation layer 16 may have a structure in which an organic film and an inorganic film are alternately stacked. The inorganic film may block the penetration of moisture and oxygen. The organic film may planarize a surface of the inorganic film. When the organic film and the inorganic film are stacked in multiple layers, a path of moisture and oxygen due to the penetration of moisture and oxygen from the outside becomes longer than that of a single layer, so that the penetration of moisture and oxygen into the light-emitting element layer 14 may be effectively blocked or prevented.

The touch sensor layer 18 may be disposed on the encapsulation layer 16. The touch sensor layer 18 may include touch sensors and wires connected to the touch sensors. The touch sensor layer 18 may include metallic patterns and an insulating film. The insulating film may insulate the metal patterns and may planarize a surface of the touch sensor layer 18.

A polarizer or color filter layer may be disposed on the touch sensor layer 18. The polarizer may improve a visibility and a contrast ratio by converting the polarization of external light reflected by the metal of the touch sensor layer and the circuit layer. The cover glass 20 may be disposed on or adhered to the polarizer. The color filter layer may include red, green, and blue color filters. The color filter layer may further include a black matrix. The color filter layer may absorb some of the wavelengths of light reflected from the metals of the circuit layer 12 and the touch sensor layer 18 to increase a visibility of an image to external light in place of the role of the polarizer and increase a color purity of an image reproduced in the pixels.

The optical device 200 may be disposed under the display panel 100. The optical device 200 may be overlapped with the second pixel area CA. Since the optical device 200 is disposed in the second pixel area CA of the display area AA, the display area AA is not limited in area by the optical device 200. Accordingly, the display panel 100 may implement a screen of a full-screen display.

The optical device 200 may include an image sensor, a proximity sensor, an illumination element, and the like. The optical device 200 may include optical elements for facial recognition. For example, the optical device 200 may include an image sensor configured to image visible light, and an IR proximity sensor for facial recognition. The IR proximity sensor may include an infrared light source 201 and an infrared imaging device 202, as illustrated in FIG. 3. The infrared light source 201 may include a flood illuminator. The flood illuminator generates infrared (IR) flashes in a dark ambient light to enable facial recognition even in dark environments. The infrared imaging device 202 may include an infrared (IR) camera. The optical device 200 may further include a dot projector 203. The dot projector 203 may irradiate the user's face with infrared through the second pixel area CA in the form of a point light source. The infrared imaging device 202 may capture light reflected from a person's face and output an image data. The infrared imaging device 202 may convert the light received through the second pixel area CA into electrical signals and then convert them into digital data to output the image data for facial recognition.

The driving circuit of the display panel 100 may include a data driver 110, a gate driver 120, a timing controller 130, a power supply 140, and a level shifter. Also, the display panel 100 may further include a touch sensor driver. The data driver 110 and the touch sensor driver may be integrated into one drive IC (Integrated Circuit). In a mobile terminal device or a wearable terminal device, the timing controller 130, the power supply 140, the level shifter 150, the data driver 110, the touch sensor deriver, and the like may be integrated into one drive IC.

The display panel 100 may be driven at a variable refresh rate (VRR) under the control of the timing controller 130. For example, the timing controller 130 may reduce a power consumption of the display apparatus by analyzing the input image and lowering the refresh rate when the input image does not change by a predefined time. In this case, the driving circuit of the display panel 100 may lower the refresh rate of the pixels P when a still image is input for a certain period of time or more under the control of the timing controller 130 to control a data writing period of the pixels P to be longer, thereby reducing the power consumption of the display apparatus. The driving circuit of the display panel 100 may lower the refresh rate when the display apparatus is operated in standby mode or in response to a user command. Further, the refresh rate may be lowered in an always on display (AOD) screen. The AOD screen is some areas of the pixels in the display area AA in which a predefined information, for example, brief information such as a remaining battery power, a time, and the like are displayed in the standby mode.

The data driver 110 may receive the pixel data of the input image received as a digital signal from the timing controller 130 and output the data voltage. The data driver 110 may convert the pixel data of the input image to a gamma compensation voltage by a digital-to-analog converter (hereinafter referred to as "DAC") and output the data voltage. The gamma reference voltage (GMA) output from the power supply 140 may be divided into the gamma compensation voltage for each grayscale by a voltage divider circuit in the data driver 110 and supplied to the DAC. The DAC may output the data voltage as the gamma compensation voltage corresponding to the grayscale value of the pixel data. The data voltages output from the DAC may be output to the data lines DL through output buffers in the respective data output channels of the data driver 110.

The driving circuit of the display panel 100 may further include a de-multiplexer DEMUX disposed between the data driver 110 and the data lines DL. In another embodiment, the de-multiplexer may be omitted. The de-multiplexer may sequentially divide (or supply) the output data voltages through the channels of the data driver 110 to the data lines DL. When the de-multiplexer is added, the number of channels in the data driver 110 may be reduced.

The gate driver 120 may be disposed on the display panel 100. The gate driver 120 may be disposed in the non-display area NA outside the display area AA in the display panel 100, or at least a portion of the gate driver 120 may be disposed at the display area AA. The gate driver 120 may supply gate signals to the gate lines GL in a single feeding method. In the single feeding method, the gate signals may be applied to one end (or one portion) of the gate lines GL. In a double feeding method, the gate signals may be applied simultaneously to both ends (or both portions) of the gate lines GL.

The gate driver 120 may include one or more shift registers and one or more edge triggers. The gate signal output from the gate driver 120 may include a scan signal and a light emission signal (hereinafter referred to as "EM pulse").

The timing controller 130 may receive a pixel data of the input image from a host system and a timing signal synchronized with the pixel data. The timing signal may include a vertical synchronization signal Vsync, a horizontal synchronization signal Hsync, a main clock CLK, and a data enable signal DE. One cycle of the vertical synchronization signal Vsync may be a period of one frame. One cycle of the horizontal synchronization signal Hsync and a data enable signal DE may be one horizontal period 1H. The pulse of the data enable signal DE may be synchronized with one line of data to be written to the pixels P on one pixel line. Since a frame period and a horizontal period may be known by counting the data enable signal DE, the vertical synchronization signal Vsync and the horizontal synchronization signal Hsync may be omitted. The timing controller 130 may transmit the pixel data of the input image to the data driver 110 and control the operation timing of the data driver 110 and the gate driver 120.

The timing controller 130 may control the operation timing of the drivers 110 and 120 of the display panel 100 with a frame frequency of the input frame frequency×i Hz by multiplying the frame frequency of the input image by a factor of i (where i is a natural number). The timing controller 130 may support a variable refresh rate. For example, the timing controller 130 may lower the refresh rate of the pixels P in low-speed driving mode by decreasing the driving frequency of the pixels P to a frequency between 1 Hz and 30 Hz.

The level shifter 150 may convert a low level voltage of the signal output from the timing controller 130 to a gate low voltage (VGL) and a high level voltage to a gate high voltage (VGH). The start pulse and the clock output from the level shifter 150 may be input to the shift register and/or the edge trigger in the gate drive portion of the gate driver 120 to drive the gate driver 120.

The power supply 140 may include a charge pump, a regulator, a buck converter, a boost converter, and the like, but embodiments of the present disclosure are not limited thereto. The power supply 140 may receive a direct current input voltage from the host system and generate the power required configured to drive the driver of the display panel 100 and the display panel 100. The power supply 140 may output constant voltages (or DC voltages) such as a gamma reference voltage, a gate high voltage VGH, a gate low voltage VGL, a pixel driving voltage ELVDD, a cathode voltage ELVSS, an initialization voltage Vinit, and the like. The gamma reference voltage GMA may be supplied to the data driver 110. The gate high voltage VGH and the gate low voltage VGL may be supplied to the level shifter 150 and the gate driver 120. Constant voltages such as the pixel driving voltage ELVDD, the cathode voltage ELVSS, and the initialization voltage Vinit may be commonly supplied to the pixels P through the power lines.

The host systems may include main circuit boards in television (TV) systems, personal computers (PC), set-top boxes, vehicle systems, home theater systems, mobile apparatuses, wearable apparatuses, and the like. An authentication module in the host system may process facial recognition of the user by comparing facial characteristics in the image received from the infrared imaging device 202 in the optical device 200 with a predefined facial feature point of the user.

Figure 4:
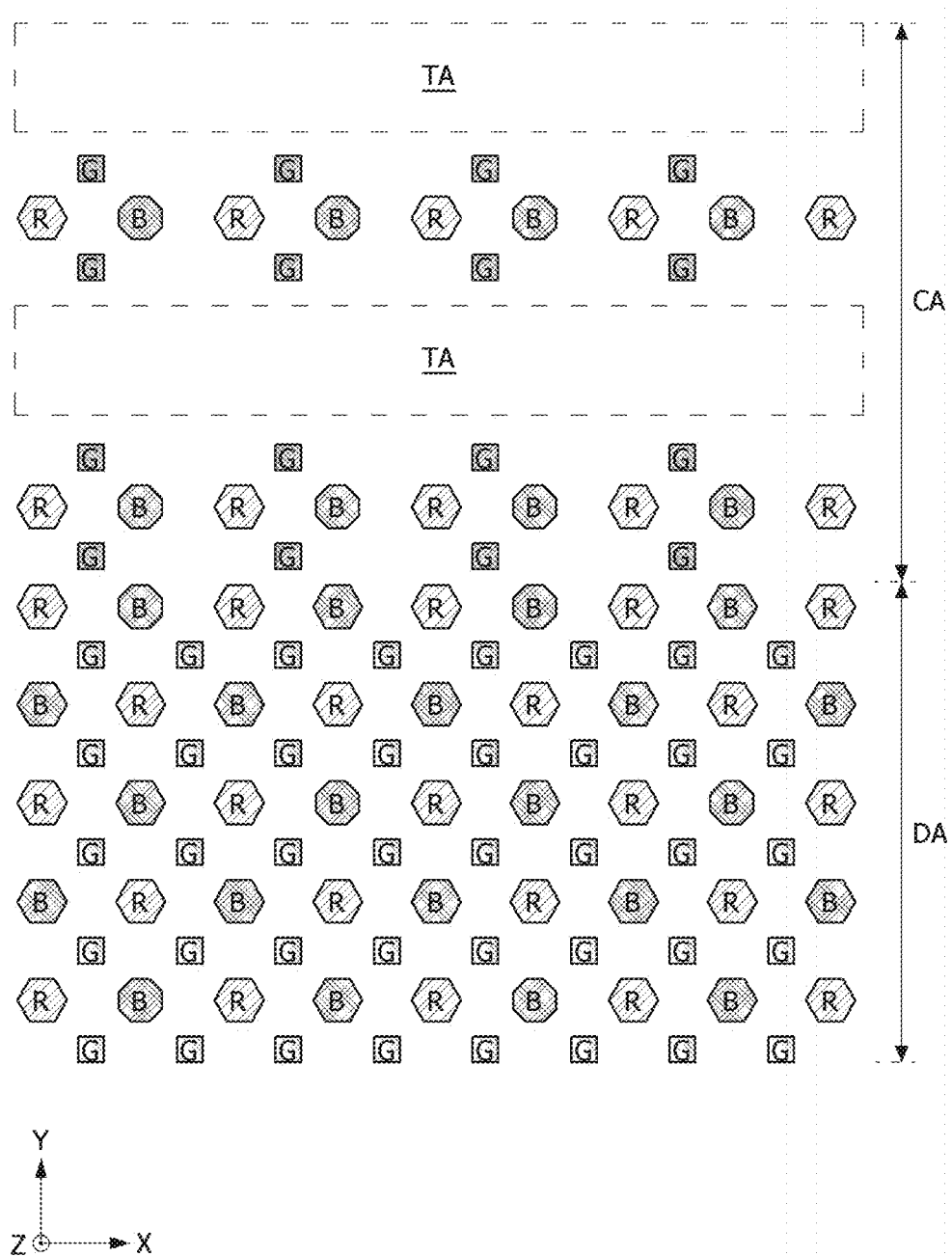
FIG. 4 illustrates an example of a pixel arrangement of a first pixel area and a second pixel area according to one or more embodiments of the present disclosure.

FIG. 4 illustrates an example pixel arrangement of a first pixel area and a second pixel area according to one or more embodiments of the present disclosure. It should be noted that the pixel arrangement is not limited to that shown in FIG. 4. In FIG. 4, the wires connected to the pixels and the pixel circuits are omitted.

Referring to FIG. 4, each of the pixels in the first pixel area DA may include R (red), G (green), and B (blue) sub-pixels, or may include sub-pixels of two colors. Each of the pixels may further include a white sub-pixel which is omitted in this drawing.

The sub-pixels may have a different luminous efficiency of the light-emitting element for each color. To account for this, the size of the sub-pixels may vary for each color. For example, among the R, G, and B sub-pixels, the B sub-pixel may be the largest and the G sub-pixel may be the smallest, but embodiments of the present disclosure are not limited thereto.

The second pixel area CA may include a plurality of pixel groups in which one or more pixels are grouped. The pixel groups may be spaced apart from neighboring pixel groups by a predetermined distance. The light transmitting portions TA may be disposed in a space between the pixel groups. The light transmitting portions TA may include non-metallic transparent media having a high light transmittance to allow light to pass through the second pixel area CA with minimal light loss.

Each of the pixel groups in the second pixel area CA may include one or two pixels, or may include three or four sub-pixels, but embodiments of the present disclosure are not limited thereto. Furthermore, each of the pixel groups may further include one or more white sub-pixels.

Due to process deviations and characteristic deviations of the driving element caused by the manufacturing process of the display panel 100, there may be differences in the electrical characteristics of the driving element between the sub-pixels, and such differences may increase as the driving time of the pixels elapses. To compensate for the deviations in the electrical characteristics of the driving element between the sub-pixels, an internal compensation technique or an external compensation technique may be applied to the display apparatus.

The internal compensation technique may sense a threshold voltage of the driving element for each sub-pixel, which drives the light-emitting element, by an internal compensation circuit implemented in each sub-pixel and compensate the gate-source voltage of the driving element for the threshold voltage. The external compensation technique may sense in a real time a current or voltage of the driving element that varies according to the electrical characteristics of the driving elements by an external compensation circuit. The external compensation technique may modulate the pixel data by adding or multiplying a compensation value for the electrical characteristic deviation (or variation) of the driving element sensed for each pixel to the pixel data (digital data) of the input image, thereby compensating for the deviation (or variation) of the electrical characteristics of the driving element in each pixel in a real time.

Figure 5:
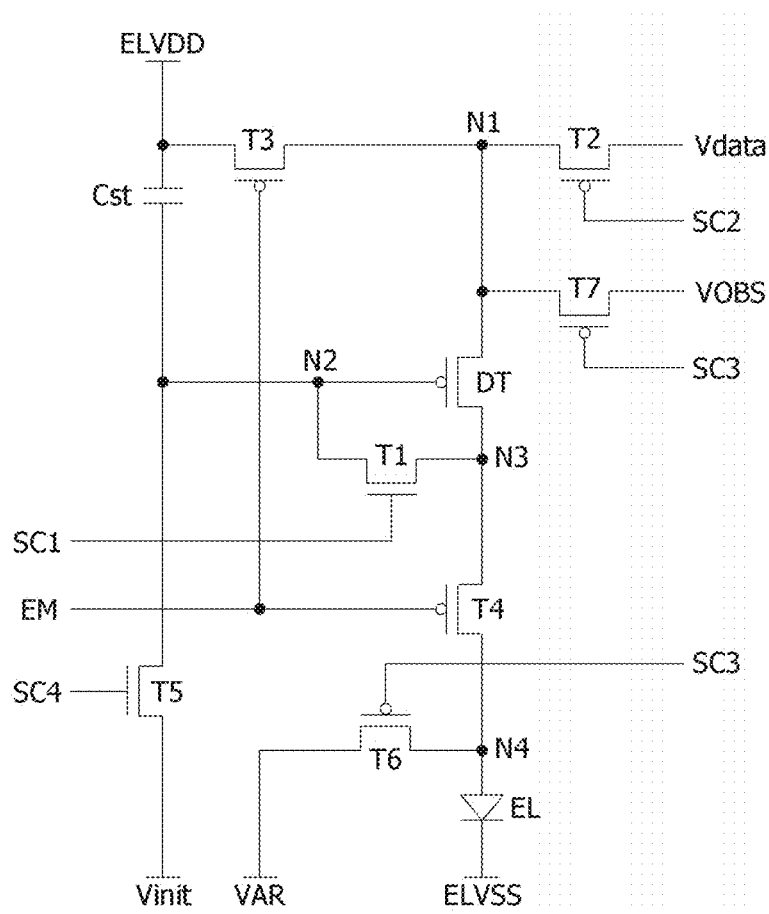
FIG. 5 is a circuit diagram illustrating a pixel circuit according to a first embodiment of the present disclosure.

The pixel circuit according to embodiments of the present disclosure may include the internal compensation circuit as illustrated in FIG. 5, but embodiments of the present disclosure are not limited thereto.

FIG. 5 is a circuit diagram illustrating a pixel circuit according to an embodiment of the present disclosure.

Referring to FIG. 5, the pixel circuit may include a light-emitting element EL, a driving element DT configured to drive the light-emitting element EL, a plurality of switching elements T1 to T7, and a capacitor Cst.

Each of first and fifth switching elements T1 and T5 may be implemented as an n-channel oxide TFT with low off-current characteristics or leakage current in the off-state. Except for the first and fifth switching elements T1 and T5, the other switching elements T2, T3, T4, T6, and T7 and the driving element DT may be implemented as a p-channel LTPS TFT, which has relatively low off-current characteristics but good current characteristics in the on-state compared to an n-channel oxide TFT. In the p-channel LTPS TFT, an off-current may increase when infrared (IR) is exposed to the semiconductor layer. The off-current may be interpreted as a leakage current.

The n-channel oxide TFT may be turned on in response to the gate-high voltage VGH, while the n-channel oxide TFT is turned off in response to the gate-low voltage VGL. The p-channel LTPS TFT may be turned on in response to the gate-low voltage VGL, while the p-channel LTPS TFT is turned off in response to the gate-high voltage VGH.

The pixel circuit may be connected to a data line to which a data voltage Vdata of the pixel data is applied and gate lines to which gate signals SC1 to SC4 and EM are applied. The pixel circuit may be connected to the power lines such as a power line to which a first compensation voltage VAR is applied, a power line to which a second compensation voltage VOBS is applied, a power line to which a pixel driving voltage ELVDD is applied, a power line to which a cathode voltage ELVSS is applied, and a power line to which an initialization voltage Vinit is applied. On the display panel, the power lines may be commonly connected to all of the pixels P.

The pixel driving voltage ELVDD and the cathode voltage ELVSS may be adjusted to voltages at which the driving element DT may operate in a saturation region. The pixel driving voltage ELVDD may be adjusted to a voltage between 2V and 3V, and the cathode voltage ELVSS may be adjusted to a voltage between −8 V and −10 V, but are not limited thereto. The gate-high voltage VGH may be adjusted to a voltage higher than the pixel driving voltage ELVDD, and the gate-low voltage VGL may be adjusted to a voltage lower than the cathode voltage ELVSS, but are not limited thereto. For example, the pixel driving voltage ELVDD may be a high-potential driving voltage, but embodiments of the present disclosure are not limited thereto. For example, the cathode voltage ELVSS may be a low-potential driving voltage, but embodiments of the present disclosure are not limited thereto.

The first compensation voltage VAR may be a voltage between −4 V and −8 V, but is not limited thereto. The first compensation voltage VAR may initialize an anode electrode of the light-emitting element EL. When the variable refresh rate (VRR) is applied by the first compensation voltage VAR, a visibility of the change in inter-frequency may be reduced. The first compensation voltage VAR may be an anode reset voltage or an initialization voltage, but is not limited thereto.

The second compensation voltage VOBS may be a voltage between 4V and 8V, but is not limited thereto. The second compensation voltage VOBS may change the direction of the current flowing to the driving element DT, thereby improving a hysteresis of the driving element DT. The second compensation voltage VOBS may be an on-bias stress voltage or a bias voltage, but is not limited thereto.

The initialization voltage Vinit may be adjusted to be lower than a lower limit voltage of the data voltage Vdata and higher than the cathode voltage ELVSS, but embodiments of the present disclosure are not limited thereto. For example, when the data voltage Vdata has a lower limit voltage of 2 V and the cathode voltage ELVSS is −9 V, the initialization voltage Vinit may be adjusted to a voltage between −5V and −7V. The data voltage Vdata may have a dynamic range between 2 V and 6 V. Within the dynamic range, the voltage level of the data voltage Vdata may be selected depending on a grayscale value of the pixel data.

The gate signals SC1 to SC4 and EM may include pulses that swing between the gate-high voltage VGH and the gate-low voltage VGL. The gate signals SC1 to SC4 and EM may include a first scan signal SC1, a second scan signal SC2, a third scan signal SC3, a fourth scan signal SC4, and an EM signal EM.

The driving element DT may generate a current according to the gate-source voltage to drive the light-emitting element EL. The driving element DT may include a gate electrode connected to a second node N2, a first electrode connected to a first node N1, and a second electrode connected to a third node N3. The capacitor Cst may be connected between a node to which the pixel driving voltage ELVDD is applied and the second node N2. The light-emitting element EL may include an anode electrode connected to a fourth node N4 and a cathode electrode to which a cathode voltage ELVSS is applied.

The first switching element T1 may be connected between the second node N2 and the third node N3. The first switching element T1 may be turned on in response to the gate-high voltage VGH of the first scan signal SC1. When the first switching element T1 is turned on, the second node N2 may be connected to the third node N3. When the first switching element T1 is turned on, the driving element DT may operate as a diode with a gate electrode and a second electrode of the driving element DT connected. The first switching element T1 may include a gate electrode connected to a gate line to which the first scan signal SC1 is applied, a first electrode connected to the second node N2, and a second electrode connected to the third node N3.

The second switching element T2 may be connected between a data line to which the data voltage Vdata is applied and the first node N1. The second switching element T2 may be turned on in response to the gate-low voltage VGL of the second scan signal SC2. When the second switching element T2 is turned on, the data line DL to which the data voltage Vdata of the pixel data is applied may be connected to the first node N1. The second switching element T2 may include a gate electrode connected to a gate line to which the second scan signal SC2 is applied, a first electrode connected to the data line to which the data voltage Vdata is applied, and a second electrode connected to the first node N1.

The third switching element T3 may be connected between a node to which the pixel driving voltage ELVDD is applied and the first node N1. The third switching element T3 may be turned on in response to the gate-low voltage VGL of the EM signal EM. When the third switching element T3 is turned on, the pixel driving voltage ELVDD may be applied to the first node N1. The third switching element T3 may include a gate electrode connected to a gate line to which the EM signal EM is applied, a first electrode to which the pixel driving voltage EVDD is applied, and a second electrode connected to the first node N1.

The fourth switching element T4 may be connected between the third node N3 and the fourth node N4. The fourth switching element T4 may be turned on in response to the gate-low voltage VGL of the EM signal EM to connect the third node N3 to the fourth node N4. The fourth switching element T4 may include a gate electrode connected to a gate line to which the EM signal EM is applied, a first electrode connected to the third node N3, and a second electrode connected to the fourth node N4.

The fifth switching element T5 may be connected between the second node N2 and a node to which the initialization voltage Vinit is applied. The fifth switching element T5 may be turned on in response to the gate-high voltage VGH of the fourth scan signal SC4. When the fifth switching element T5 is turned on, the initialization voltage Vinit may be applied to the second node N2. The fifth switching element T5 may include a gate electrode connected to a gate line to which the fourth scan signal SC4 is applied, a first electrode connected to the second node N2, and a second electrode to which the initialization voltage Vinit is applied.

The sixth switching element T6 may be connected between the fourth node N4 and a node to which the first compensation voltage VAR is applied. The sixth switching element T6 may be turned on in response to the gate-low voltage VGL of the third scan signal SC3. When the sixth switching element T6 is turned on, the first compensation voltage VAR is applied to the anode electrode of the light-emitting element EL connected to the fourth node N4. For example, when the sixth switching element T6 is turned on, the first compensation voltage VAR may be applied to the anode electrode of the light-emitting element EL connected to the fourth node N4, thereby initializing the anode electrode. The sixth switching element T6 may include a gate electrode connected to a gate line to which the third scan signal SC3 is applied, a first electrode connected to the fourth node N4, and a second electrode to which the first compensation voltage VAR is applied.

The seventh switching element T7 may be connected between the first node N1 and a node to which the second compensation voltage VOBS is applied. The seventh switching element T7 may be turned on in response to the gate-low voltage VGL of the third scan signal SC3. When the seventh switching element T7 is turned on, the second compensation voltage VOBS may be applied to the first node N1. The seventh switching element T7 may include a gate electrode connected to a gate line to which the third scan signal SC3 is applied, a first electrode connected to the first node N1, and a second electrode to which the second compensation voltage VOBS is applied. The direction of the current of the driving element DT may be changed by the second compensation voltage VOBS, thus improving the threshold voltage of the driving element DT. The seventh switching element T7 may be a bias element, but is not limited thereto.

The compensation voltages VOBS and VAR may be the voltages to compensate for the fluctuations (or variations) in luminance of the pixels on a time axis when the refresh rate of the pixels is low. The switching elements T6 and T7, which apply the compensation voltages VOBS and VAR to the pixels, may be omitted if the pixels are constantly driven at a high refresh rate.

Figure 6:
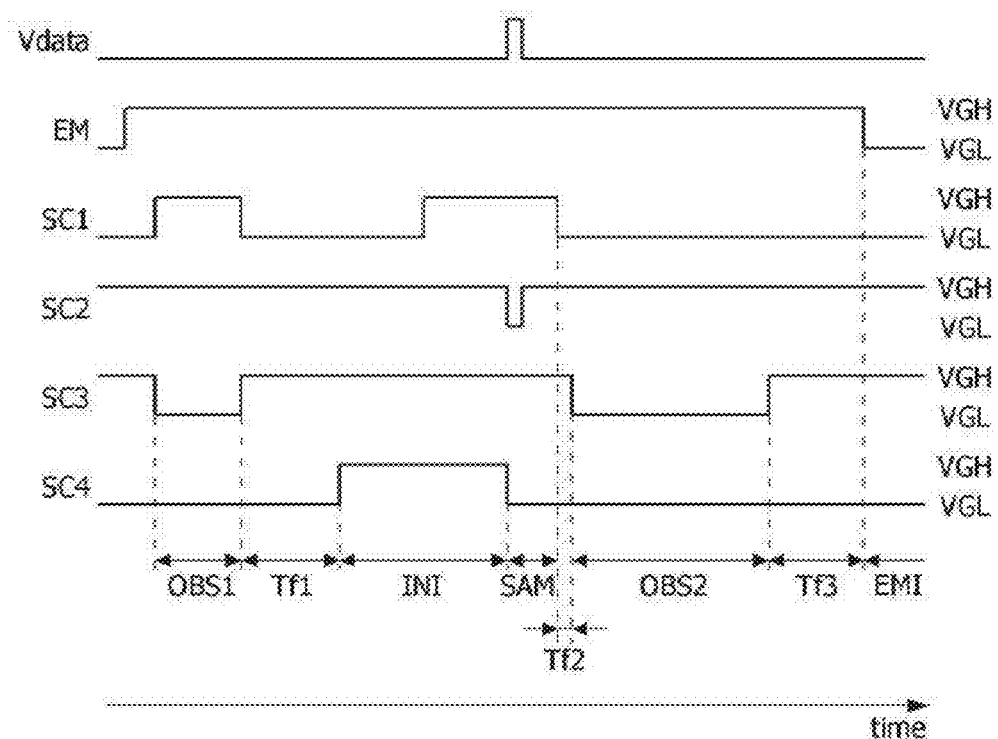
FIG. 6 is a waveform diagram illustrating gate signals applied to a pixel circuit according to the first embodiment of the present disclosure.

FIG. 6 is a waveform diagram illustrating gate signals applied to the pixel circuit of FIG. 5 according to an embodiment of the present disclosure.

Referring to FIG. 6, the driving period of the pixels may include a first on-bias period OBS1, an initialization period INI, a sampling period SAM, a second on-bias period OBS2, and an emission period EMI. A first floating period Tf1 may be adjusted between the first on-bias period OBS1 and the initialization period INI. A second floating period Tf2 may be adjusted between the sampling period SAM and the second on-bias period OBS2. A third floating period Tf3 may be adjusted between the second on-bias period OBS2 and the emission period EMI.

During the first on-bias period OBS1, the voltage of the third and fourth scan signals SC3 and SC4 may be the gate-low voltage VGL and the voltage of the first and second scan signals SC1 and SC2 may be the gate-high voltage VGH. The voltage of the EM signal EM may be the gate-high voltage VGH during the first on-bias period OBS1. Therefore, during the first on-bias period OBS1, the first, sixth, and seventh switching elements T1, T6, and T7 may be turned on to apply the second compensation voltage VOBS to the first node N1 and the first compensation voltage VAR to the fourth node N4.

During the first on-bias period OBS1, the second, third, fourth, and fifth switching elements T2, T3, T4, and T5 may be in the off-state. During the first on-bias period OBS1, although the driving element DT may be turned on, no current may be supplied to the light-emitting element EL because the fourth switching element T4 is in the off-state. Further, because the voltage difference between the first compensation voltage VAR and the cathode voltage ELVSS is less than the threshold voltage of the light-emitting element EL, the light-emitting element EL does not emit light during the first on-bias period OBS1.

During the first on-bias period OBS1, the driving element DT may be turned on, and therefore the voltage of the first and third nodes N1 and N3 may be the second compensation voltage VOBS and the voltage of the fourth node N4 may be the first compensation voltage VAR. The voltage of the second node N2 may be a voltage Vdata+Vth obtained by adding the threshold voltage Vth of the driving element DT to the previously stored data voltage Vdata.

During the first floating period Tf1, the voltage of the first and fourth scan signals SC1 and SC4 may be the gate-low voltage VGL, and the voltage of the second and third scan signals SC2 and SC3 may be the gate-high voltage VGH. The voltage of the EM signal EM may be the gate-high voltage VGH during the first floating period Tf1. Therefore, during the first floating period Tf1, the first to fourth nodes N1 to N4 may be floated to maintain their previous states because the first to seventh switching elements T1 to T7 are all in the off-state.

During the initialization period INI, the voltage of the first to fourth scan signals SC1, SC2, SC3, and SC4 and the EM signal EM may be the gate-high voltage VGH. Therefore, during the initialization period INI, the first and fifth switching elements T1 and T5 are turned on to apply the initialization voltage Vinit to the second and third nodes N2 and N3, and the initialization voltage Vinit may also be applied to the first node N1 via the driving element DT that maintains the on-state. During the initialization period INI, the light-emitting element EL is in the off-state and therefore does not emit light.

During the initialization period INI, the voltage of the first, second, and third nodes N1, N2, and N3 may be the initialization voltage Vinit. During the initialization period INI, the fourth node N4 may be floated and maintained in its previous state because the fourth and sixth switching elements T4 and T6 are in the off-state.

During the sampling period SAM, the voltage of the second scan signal SC2 may be generated as a scan pulse of the gate-low voltage VGL synchronized with the data voltage Vdata of the pixel data, and then inverted to the gate-high voltage VGH. During the sampling period SAM, the voltage of the first and third scan signals SC1 and SC3 and the EM signal EM may be the gate-high voltage VGH, and the voltage of the fourth scan signal SC4 may be the gate-low voltage VGL. When the second switching element T2 is turned on in response to the gate-low voltage VGL of the scan pulse in the sampling period SAM, the data voltage Vdata may be applied to the first node N1, and the data voltage Vdata may also be applied to the second and third nodes N2 and N3 through the driving element DT in the on-state. In this case, the voltage of the first node N1 is the data voltage Vdata, and the voltage of each of the second and third nodes N2 and N3 is a voltage Vdata+Vth which is obtained by adding the threshold voltage Vth of the driving element DT to the data voltage Vdata. During the sampling period SAM, the fourth node N4 is in a floating state, and the light-emitting element EL is in the off-state and therefore does not emit light.

During the second floating period Tf2, the voltage of the first and fourth scan signals SC1 and SC4 may be the gate-low voltage VGL, and the voltage of the second and third scan signals SC2 and SC3 may be the gate-high voltage VGH. The voltage of the EM signal EM may be the gate-high voltage VGH during the second floating period Tf2. Therefore, during the second floating period Tf2, the first to fourth nodes N1 to N4 may be floated to maintain their previous states because the first to seventh switching elements T1 to T7 are all in the off-state.

During the second on-bias period OBS2, the voltage of the first, third, and fourth scan signals SC1, SC3, and SC4 may be the gate-low voltage VGL and the voltage of the second scan signal SC2 may be the gate-high voltage VGH. The voltage of the EM signal EM is the gate-high voltage VGH during the second on-bias period OBS2. During the second on-bias period OBS2, the first, second, third, fourth, and fifth switching elements T1, T2, T3, T4, and T5 may be in the off-state. During the second on-bias period OBS2, the sixth and seventh switching elements T6 and T7 may be turned on to apply the second compensation voltage VOBS to the first node N1 and the first compensation voltage VAR to the fourth node N4. During the second on-bias period OBS2, the light-emitting element EL does not emit light. During the second on-bias period OBS2, the voltage of the first node N2 may maintain the previous state and therefore may be a voltage Vdata+Vth.

During the third floating period Tf3, the voltage of the first and fourth scan signals SC1 and SC4 may be the gate-low voltage VGL, and the voltage of the second and third scan signals SC2 and SC3 may be the gate-high voltage VGH. The voltage of the EM signal EM may be the gate-high voltage VGH during the third floating period Tf3. Therefore, during the third floating period Tf3, the first to fourth nodes N1 to N4 may be floated to maintain their previous states because the first to seventh switching elements T1 to T7 are all in the off-state.

During the emission period EMI, the voltage of the first and fourth scan signals SC1, SC4 and the EM signal EM may be the gate-low voltage VGL and the voltage of the second and third scan signals SC2 and SC3 may be the gate-high voltage VGH. During the emission period EMI, the third and fourth switching elements T3 and T4 may be turned on in response to the gate-low voltage VGL of the EM signal EM. Therefore, a current path may be formed between the pixel driving voltage ELVDD and the light-emitting element EL during the emission period EMI.

During the emission period EMI, a current, which is determined according to the gate-source voltage of the driving element DT, flows through the light-emitting element EL so that the light-emitting element EL may emit light at a luminance corresponding to the grayscale value of the pixel data. During the emission period EMI, the first, second, fifth, sixth, and seventh switching elements T1, T2, T5, T6, and T7 other than the third and fourth switching elements T3 and T4 may be in the off-state.

The current-voltage characteristic of the transistor constituting the pixel circuit may be changed by light emitted from the optical device 200, such as, infrared (IR). A LTPS TFT may increase a leakage current when the LTPS TFT is exposed to infrared (IR).

Figure 7:
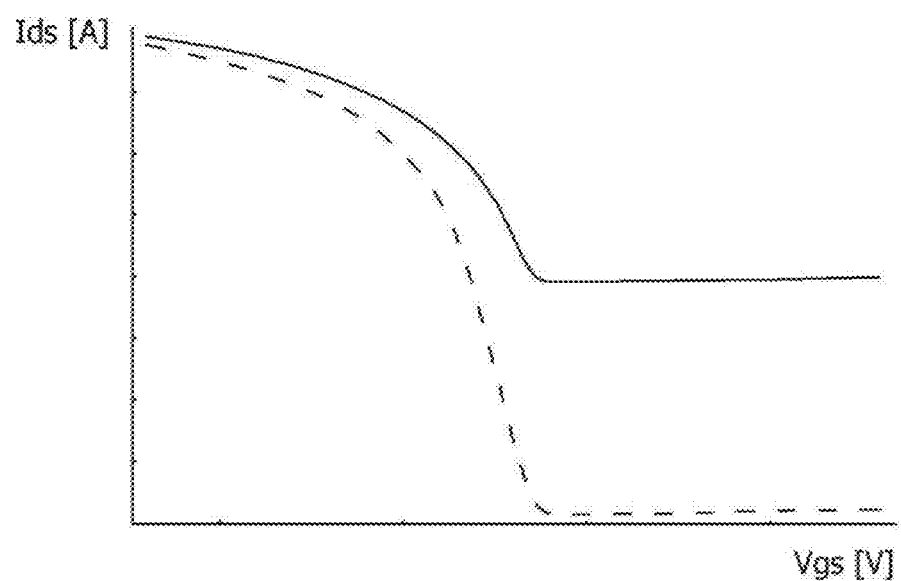
FIG. 7 illustrates a current-voltage characteristic of a transistor that varies depending on whether or not it is exposed to infrared rays according to the first embodiment of the present disclosure.

FIG. 7 illustrates a current-voltage characteristic of a transistor according to an embodiment of the present disclosure.

In FIG. 7, a horizontal axis is a gate-source voltage Vgs of the transistor and a vertical axis is a drain-source current Ids of the transistor.

Referring to FIG. 7, when the semiconductor channel of the transistor is exposed to infrared (IR), the drain-source current Ids flowing through the semiconductor channel of the transistor may be increased. In this case, the black luminance of the second pixel area CA overlapping the optical device 200 increases, and thus the difference from a black luminance of the first pixel area DA may be visible. For example, when the semiconductor channel of a transistor is exposed to infrared (IR), the gate-source voltage Vgs of the driving element DT increases, resulting in a luminance deviation. The gate-source voltage Vgs of the driving element DT should be minimized so that no current flows through the light-emitting element EL when black grayscale data is written into the pixel. However, if a leakage current is generated in the driving element DT when black grayscale data is written to the pixel, or if a leakage current is generated in transistors that may affect the gate-source voltage Vgs of the driving element DT, such as the third switching element T3, the fourth switching element T4, and the seventh switching element T7, the current may flow to the light-emitting element EL, which may increase the black luminance. The increase in the black luminance may cause the decrease in a contrast ratio of the pixels, which may result in a deterioration in the display quality of the image reproduced on the display panel 100.

From the experimental results, it is confirmed that when the transistors of the pixel circuit described with reference to FIG. 5 are exposed to infrared, the voltages of the main nodes N1 to N4 are changed.

Figure 8:
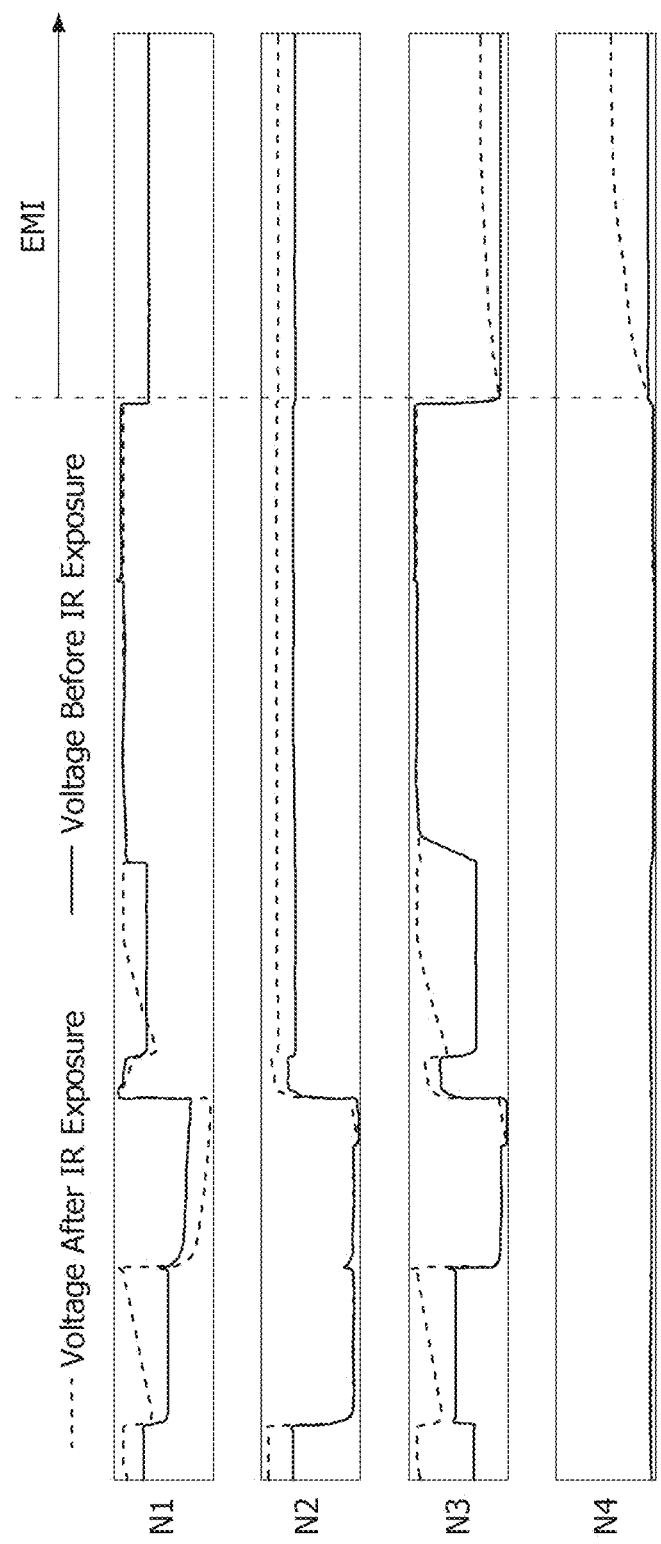
FIG. 8 illustrates voltage changes at main nodes in a pixel circuit before and after the infrared exposure according to the first embodiment of the present disclosure.

FIG. 8 illustrates voltage changes at the main nodes in the pixel circuit before and after the infrared exposure according to an embodiment of the present disclosure.

In FIG. 8, a horizontal axis is time (ms) and a vertical axis is voltage (V). In FIG. 8, a solid line is a voltage before the infrared (IR) exposure, and a dotted line is a voltage after the infrared (IR) exposure.

As shown in FIG. 8, it is confirmed that the voltage of the main nodes N1 to N4, for example, the voltage difference between the first and second nodes N1 and N2, which is the gate-source voltage Vgs of the driving element DT, increases after the infrared (IR) exposure compared to before the infrared (IR) exposure. As a result, the voltage of the third and fourth nodes N3 and N4 may increase and the current of the light-emitting element EL may increase during the emission period EMI, resulting in an increase in the luminance of the pixels. For example, when the transistor is exposed to infrared (IR), the leakage current of the third and fourth switching elements T3 and T4 connected to the first and fourth nodes N1 and N4 increases, which in turn increases the gate-source voltage Vgs of the driving element DT. Accordingly, a luminance deviation in the display apparatus may occur when the IR proximity sensor is activated and when the IR proximity sensor is deactivated.

To prevent the transistors constituting the pixel circuit from being exposed to infrared (IR), a shielding layer may be disposed under each of the transistors of all pixels in the display area AA. In such a configuration, the light transmittance of the second pixel area CA may be lowered, resulting in the reduced and uneven amount of light received by the optical device 200, which may cause distortion of the image produced by the optical device 200. This may lead to poor facial recognition performance. In the present disclosure, to prevent a change in the characteristic of the transistor caused by the infrared exposure while reducing the decrease in the transmittance of the pixels, a shielding layer may be applied to a transistor that has a large effect on the current of the light-emitting element EL without a shielding layer to a transistor that has a relatively small effect on the current of the light-emitting element EL.

The increase in luminance of the transistor caused by infrared exposure may be the effect of the second compensation voltage VOBS. When the seventh switching element T7 is exposed to infrared (IR), the leakage current of the seventh switching element T7 may increase. When the leakage current in the seventh switching element T7 increases, the second compensation voltage VOBS is supplied to the first node N1 of the driving element DT, causing the gate-source voltage Vgs of the driving element DT to increase. As a result, luminance variations may occur in the display apparatus when the IR proximity sensor is activated and when the IR proximity sensor is deactivated, and the black luminance of the pixel may increase.

Figure 9:
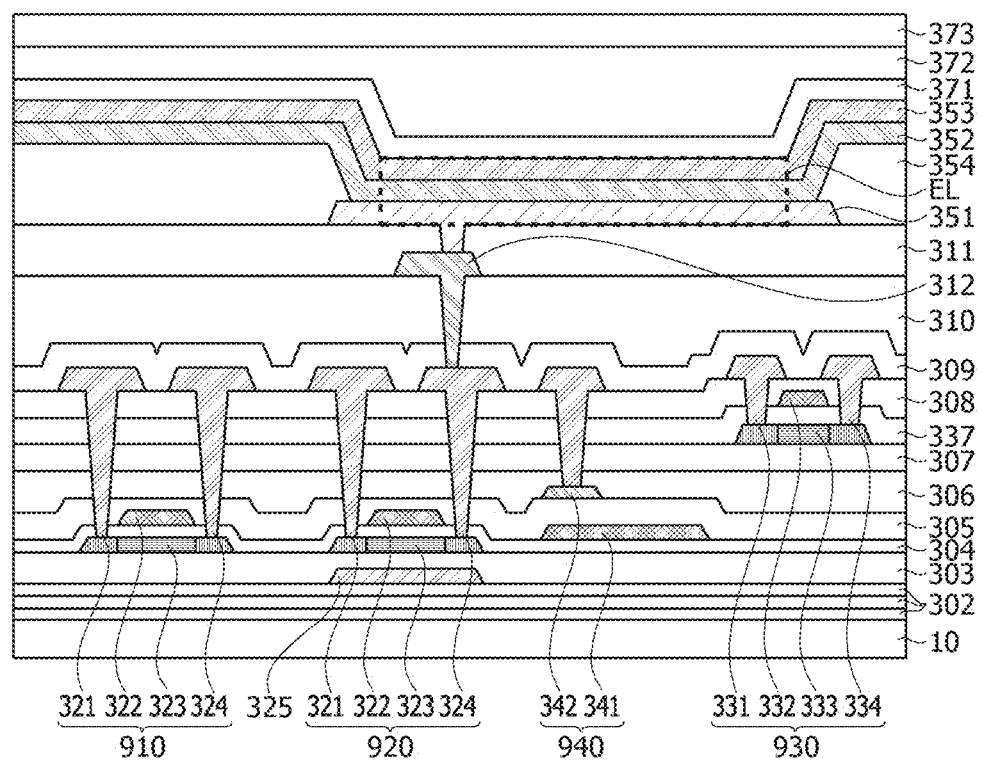
FIG. 9 is a cross-sectional view illustrating a cross-sectional structure of a display panel according to the first embodiment of the present disclosure.

FIG. 9 is a cross-sectional view illustrating a cross-sectional structure of a display panel according to an embodiment of the present disclosure.

Referring to FIG. 9, the display panel 100 may include a p-channel LTPS TFT (hereinafter, referred to as a "first transistor") 910 without a shielding layer, a p-channel LTPS TFT (hereinafter, referred to as a "second transistor") 920 including a shielding layer, and an n-channel oxide TFT (hereinafter, referred to as a "third transistor") 930 without a shielding layer.

A shielding layer 325 formed of a first metal layer may be disposed on the substrate 10 of the display panel 100. A buffer layer 302 having one or more insulating layers stacked thereon may be disposed between the substrate 10 and the first metal layer, but embodiments of the present disclosure are not limited thereto.

The substrate 10 may be formed of a multi-layer in which an organic layer and an inorganic layer are alternately stacked, but embodiments of the present disclosure are not limited thereto. For example, the substrate 10 may be formed by alternately stacking organic films such as polyimide and inorganic films such as silicon oxide film (SiOx). For example, the substrate 10 may include one or more layers. For example, one or more layers may be a material such as polyimide (PI), polyethylene terephthalate (PEN), polyethylene naphthalate (PC), polycarbonate (PES), polyethersulfone (PAR), polyarylate (PSF), cyclo-olefin copolymer (COC), and the like, but embodiments of the present disclosure are not limited thereto. For example, a glass is not excluded as one or more materials.

The buffer layer 302 may block moisture or the like that may penetrate from an outside. The buffer layer 302 may be formed by stacking silicon oxide (SiOx) and silicon nitride (SiNx) in multi-layer, but embodiments of the present disclosure are not limited thereto.

The shielding layer 325 may be disposed between the second transistor 920 and the optical device 200 to block infrared (IR) that affects the current-voltage characteristic of the second transistor 920.

A constant voltage output from the power supply 140 may be applied to the shielding layer 325. When the constant voltage is applied to the shielding layer 325, the residual charges that may accumulate in a lower film of the second transistor 920 may be reduced, thereby reducing the change in the current-voltage characteristic of the second transistor 920 due to the accumulation of the residual charges.

The shielding layer 325 may overlap the semiconductor layer 323 of the second transistor 920. The shielding layer 325 may be a single layer or multi-layer of any one of molybdenum (Mo), aluminum (Al), chromium (Cr), nickel (Ni), neodymium (Nd), and copper (Cu), or alloys thereof, but embodiments of the present disclosure are not limited thereto.

An insulating layer 303 may be disposed on the shielding layer 325. The insulating layer 303 may cover the shielding layer 325 and the buffer layer 302. For example, the insulating layer 303 may include a silicon oxide film (SiOx), a silicon nitride film (SiNx), or a double layer of a silicon oxide film (SiOx) and a silicon nitride film (SiNx), but embodiments of the present disclosure are not limited thereto. The insulating layer 303 may include at least one or more layers, but embodiments of the present disclosure are not limited thereto.

Semiconductor layers 323 of the first and second transistors 910 and 920 may be disposed on the insulating layer 303. The semiconductor layers 323 of the first and second transistors 910 and 920 may be formed of polysilicon.

An insulating layer 304 may cover the semiconductor layers 323 and the insulating layer 303. For example, the insulating layer 304 may be formed of the same material as the insulating layer 303, but embodiments of the present disclosure are not limited thereto.

A second metal layer may be disposed on the insulating layer 304. The second metal layer may include the gate electrodes 322 of the first and second transistors 910 and 920, the gate lines, and a lower electrode 341 of a capacitor 940. For example, the second metal layer may be a single layer or a multi-layer of any one of molybdenum (Mo), aluminum (Al), chromium (Cr), gold (Au), titanium (Ti), nickel (Ni), neodymium (Nd), tungsten (W), and copper (Cu), or an alloy thereof, but embodiments of the present disclosure are not limited thereto. For example, the gate electrode 322, the gate line, and the lower electrode 341 of the capacitor 940 may be formed in the same layer and may be formed of the same material.

An insulating layer 305 may cover the second metal layer and the insulating layer 304. For example, the insulating layer 305 may be formed of the same material as the insulating layer 303, but embodiments of the present disclosure are not limited thereto.

A third metal layer may be disposed on the insulating layer 305. The third metal layer may include an upper electrode 342 of the capacitor 940. The third metal layer may be formed of the same material as the second metal layer, but embodiments of the present disclosure are not limited thereto.

An insulating layer 306 may cover the third metal layer and the insulating layer 305. For example, the insulating layer 306 may be formed of the same material as the insulating layer 303, but embodiments of the present disclosure are not limited thereto.

An insulating layer 307 may cover the insulating layer 306 under the insulating layer 307. For example, the insulating layer 307 may be formed of the same material as the insulating layer 303, but embodiments of the present disclosure are not limited thereto.

A third transistor 930 may be disposed on the insulating layer 307. A semiconductor layer 333 of the third transistor 930 may be disposed on the insulating layer 307. The semiconductor layer 333 may be formed of an oxide semiconductor.

An insulating layer 337 may cover the insulating layer 307. For example, the insulating layer 337 may be formed of the same material as the insulating layer 303, but embodiments of the present disclosure are not limited thereto.

A fourth metal layer may be disposed on the insulating layer 337. The fourth metal layer may include a gate electrode 332 and a gate line of the third transistor 930. The fourth metal layer may be formed of the same material as the second metal layer, but embodiments of the present disclosure are not limited thereto.

An insulating layer 308 may cover the fourth metal layer and the insulating layer 337. For example, the insulating layer 308 may be formed of the same material as the insulating layer 303, but embodiments of the present disclosure are not limited thereto.

A fifth metal layer may be disposed on the insulating layer 308. The fifth metal layer may include first and second electrodes 321, 324, 331, 334 of the transistors 910, 920, 930 and the data lines, etc. The first and second electrodes 321, 324 331, 334 of the transistors 910, 920, 930 may be in contact with the corresponding semiconductor layers 323 and 333 through contact holes that penetrate the insulating layers under the first and second electrodes 321, 324, 331, 334. For example, the fifth metal layer may be a single layer or a multi-layer of any one of molybdenum (Mo), aluminum (Al), chromium (Cr), gold (Au), titanium (Ti), nickel (Ni), neodymium (Nd), and copper (Cu), or an alloy thereof, but embodiments of the present disclosure are not limited thereto. The first and second electrodes 321, 324, 331, 334 of the transistors 910, 920, 930 may be formed of the same material and may be formed in the same layer.

A protective layer 309 formed of an insulating layer may cover the insulating layer 308 and the fifth metal layer under the protective layer 309. The protective layer 309 may be formed of the same material as the insulating layer 303, but embodiments of the present disclosure are not limited thereto.

A first planarization layer 310 may cover the protective layer 309, and a sixth metal layer may be disposed on the first planarization layer 310. The sixth metal layer may include a connection electrode 312 that is connected to a first electrode or a second electrode of the second transistor 920 through a contact hole that passes through the first planarization layer 310. The first planarization layer 310 may planarize an upper portion of the transistors 910, 920, and 930 and protect the transistors 910, 920, and 930.

A second planarization layer 311 may cover the fifth metal layer and the first planarization layer 310. The light-emitting element layer 14 as shown in FIG. 2 may be disposed on the second planarization layer 311. The light-emitting element layer 14 may include an anode electrode 351, an organic compound layer 352, a cathode electrode 353, and a bank layer 354, but is not limited thereto.

The anode electrode 351 of the light-emitting element EL may be disposed on the second planarization layer 311. The planarization layers 310 and 311 may be formed of an organic insulating material. For example, the planarization layers 310 and 311 may be formed of an organic material including an acrylic resin, an epoxy resin, a phenolic resin, a polyamide resin, or a polyimide resin, but embodiments of the present disclosure are not limited thereto. The connecting electrode 312 may be disposed between the first planarization layer 310 and the second planarization layer 311. The connection electrode 312 may electrically connect the second transistor 920 and the light-emitting element EL. The connection electrode 312 may be formed of the same material as the fifth metal layer, but embodiments of the present disclosure are not limited thereto.

The bank layer 354 exposing the anode electrode 351 may be disposed on the second planarization layer 311. The size and shape of a light emission area in each of the sub-pixels may be varied by the bank layer 354. The bank layer 354 may be formed of an organic insulating material having photosensitivity or a material including black, but is not limited thereto. The bank layer 354 may be formed of at least one or more of inorganic insulating materials such as silicon nitride (SiNx) or silicon oxide (SiOx), or an organic insulating material such as benzocyclobutene (BCB), acrylic resin, epoxy resin, phenolic resin, polyamide resin, or polyimide resin, but embodiments of the present disclosure are not limited thereto. The bank layer 354 may be disposed to cover an edge portion (or a periphery portion) of the anode electrode 351.

A spacer may be further disposed on the bank layer 354. The spacer may buffer an empty space between the substrate 10 on which the light-emitting element EL is formed and the upper substrate, thereby minimizing a damage to the display apparatus from an external impact. The spacer may be formed of the same material as the bank layer 354, and may be formed simultaneously with the bank layer 354, but embodiments of the present disclosure are not limited thereto.

The organic compound layer 352, including the light-emitting layer of the light-emitting element EL, may cover the anode electrode 351 and the bank layer 354. The cathode electrode 353 of the light-emitting element EL may be disposed on the organic compound layer 352. An encapsulation layer may be disposed on the cathode electrode 353, and a touch sensor layer may be disposed on the encapsulation layer. For example, the organic compound layer 352 may be a light emission layer interposed between the electrodes in the light-emitting element layer 14 described above with reference to FIG. 2.

The light emission layer of the light-emitting element EL may include an organic light emission layer, an inorganic light emission layer, a quantum dot light emission layer, a micro light-emitting diode, or a micro-mini light-emitting diode, but embodiments of the present disclosure are not limited thereto. The light emission layer may include a red emission layer, a green emission layer, and a blue emission layer. In another embodiment, the light emission layer may further include a white emission layer. When the light emission layer of the light-emitting element EL includes a white emission layer, a color filter layer for converting white light from the white emission layer into light of a different color may be disposed on the light-emitting element EL.

The organic compound layer 352 may further include a hole transport layer and an electron transport layer in addition to the light emission layer. It may have a structure stacked in the order or reverse order of a hole transfer layer, a light emission layer, and an electron transfer layer. The hole transfer layer may include a hole injection layer, a hole transport layer, an electron blocking layer, and the like, but embodiments of the present disclosure are not limited thereto. The electron transfer layer may include an electron injection layer, an electron transport layer, a hole blocking layer, and the like, but embodiments of the present disclosure are not limited thereto. For another example, a capping layer may be further disposed on the cathode electrode 353. The capping layer may minimize damage to the cathode electrode 353 of the light-emitting element EL and the organic compound layer 352 under the cathode electrode 353 from an external light source. The capping layer may be formed of an organic or inorganic film. The capping layer may be disposed as an inorganic film using a material such as LiF, and may further include an organic layer, but embodiments of the present disclosure are not limited thereto. For example, the capping layer may have a stacked structure of an organic film and an inorganic film, and the thickness of the organic layer and the thickness of the inorganic layer may be different. For example, the thickness of the organic layer may be greater than the thickness of the inorganic layer. In another example, the capping layer may be formed of two or more layers by stacking materials having different refractive indices. This may improve the light efficiency of the display panel.

For example, if the hole transport layer, the light emission layer, and the electron transport layer between the anode electrode 351 and the cathode electrode 353 are referred to as one light-emitting part, the organic compound layer 352 may consist of two or more light-emitting parts. The light emission layers included in the two or more light-emitting parts may emit light of the same color. For example, the same color may be red, green, and blue. A charge generation layer may be further formed between two or more light-emitting parts. The charge generation layer may allow electrons and holes to migrate to the light emission layer and may regulate the charge balance. The charge generation layer may include a p-n junction layer and may include an N-type charge generation layer and a P-type charge generation layer.

The anode electrode 351 may include a highly reflective metallic material such as a stacked structure (Ti/Al/Ti) of aluminum (Al) and titanium (Ti), a stacked structure (ITO/Al/ITO) of aluminum (Al) and Indium Tin Oxide (ITO), indium tin oxide (ITO), indium zinc oxide (IZO), and APC alloy, and may be formed of a single layer or a multi-layer, but embodiments of the present disclosure are not limited thereto.

The cathode electrode 353 may include a transparent conductive material such as indium tin oxide (ITO) or indium zinc oxide (IZO) or a metal through which visible light is transmitted, but embodiments of the present disclosure are not limited thereto. Further, the cathode electrode 353 may include a translucent conductive material that transmits light. For example, the cathode electrode 353 may be formed of at least one or more of the alloys such as LiF/Al, CsF/Al, Mg:Ag, Ca/Ag, Ca:Ag, LiF/Mg:Ag, LiF/Ca/Ag, and LiF/Ca:Ag, but embodiments of the present disclosure are not limited thereto.

An encapsulation layer may be formed on the cathode electrode 353. The encapsulation layer may protect the light-emitting element EL from oxygen and/or moisture from the outside. The encapsulation layer may be formed of at least two or more stacked insulating layers 371, 372, and 373, including an inorganic film and an organic film, but embodiments of the present disclosure are not limited thereto.

A touch sensor lay may be disposed on the encapsulation layer. The touch sensor layer may be configured to recognize a user's touch.

FIGS. 10 to 13 illustrate pixel circuits that may reduce the transmittance degradation of the pixels while preventing changes in the transistor characteristics due to infrared exposure according to one or more embodiments of the present disclosure. In FIGS. 10 to 13, a detailed description of the components that are substantially the same as those of the pixel circuit of the above-described embodiments will be omitted or briefly described.

Figure 10:
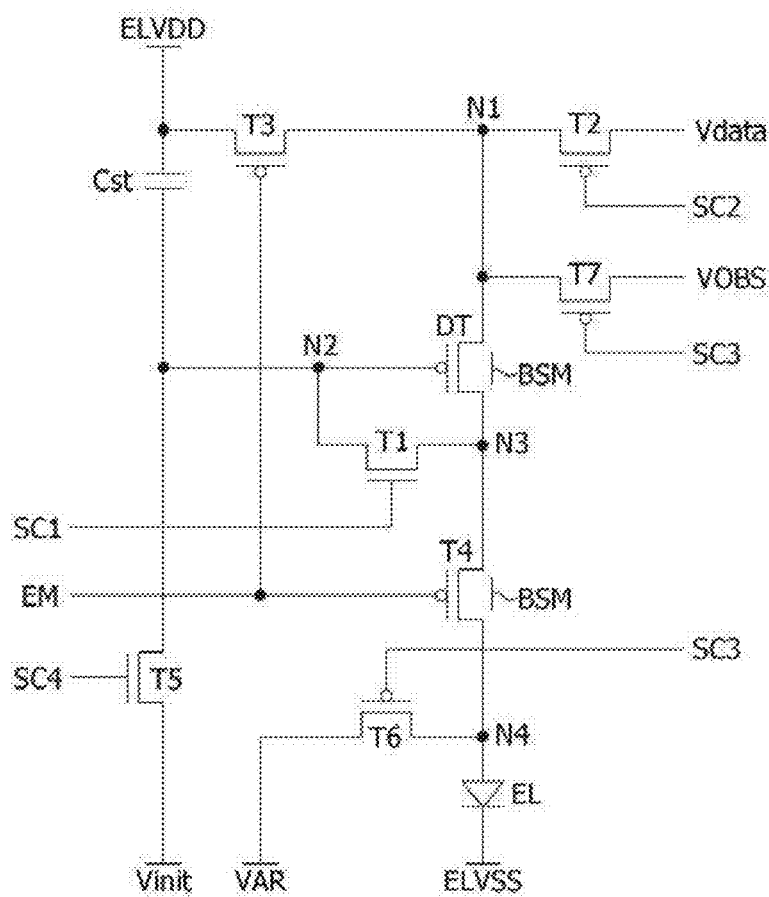
FIG. 10 is a circuit diagram illustrating a pixel circuit according to a second embodiment of the present disclosure.

FIG. 10 is a circuit diagram illustrating a pixel circuit according to a second embodiment of the present disclosure.

Referring to FIG. 10, the pixel circuit may include switching elements T1 and T5 that are implemented as an n-channel oxide TFT, and driving elements DT and switching elements T2, T3, T4, T6, T7 implemented as a p-channel LTPS TFT that are implemented as a p-channel oxide TFT.

In the pixel circuit, a shielding layer BSM may be disposed under the driving element DT and a fourth switching element T4. The shielding layer BSM is disposed on the lower portions of the driving element DT and the fourth switching element T4 to block infrared (IR) from the optical device 200. The driving element DT and the fourth switching element T4 may be implemented as an LTPS TFT, the leakage current of which may be sensitively changed when exposed to infrared (IR). When the shielding layer BSM is applied to the driving and switching elements DT and T4, the driving and switching elements DT and T4, which generate the driving current of the light-emitting element EL and are in the current path of the light-emitting element EL, are not exposed to infrared (IR), thus preventing the black luminance of the pixels from increasing.

According to one or more embodiments of the present disclosure, when a semiconductor layer of a transistor of the element is exposed to infrared (IR), a photo current may be generated in the semiconductor layer of the transistor. The photocurrent may increase the leakage current of the transistor. When black grayscale data is written to a pixel, the black luminance of the pixel may increase if a transistor that affects the gate-source voltage Vgs of the driving element DT and the current flowing to the light-emitting element EL are exposed to infrared (IR). The shielding layer BSM disposed under the transistor of the element may block infrared (IR) from irradiating the semiconductor layer of the transistor, thereby blocking the leakage current of the transistor caused by infrared (IR) and preventing the black luminance of the pixel from increasing.

The shielding layer BSM disposed under the fourth switching element T4 may prevent the leakage current from the fourth switching element T4 when exposed to infrared (IR), thereby preventing the black luminance of the pixel from increasing. If there is no leakage current in the fourth switching element T4, the increase in black luminance of the pixel may be suppressed even if the leakage current occurs in other switching elements.

The shielding layer BSM may not be applied to the first switching element T1, the second switching element T2, the third switching element T3, the fifth switching element T5, the sixth switching element T6, and the seventh switching element T7. Since there is no shielding layer BSM under the switching transistors T1, T2, T3, T5, T6, and T7, transmittance of the display panel may be improved in the light emitting and receiving paths of the optical device 200.

Figure 11:
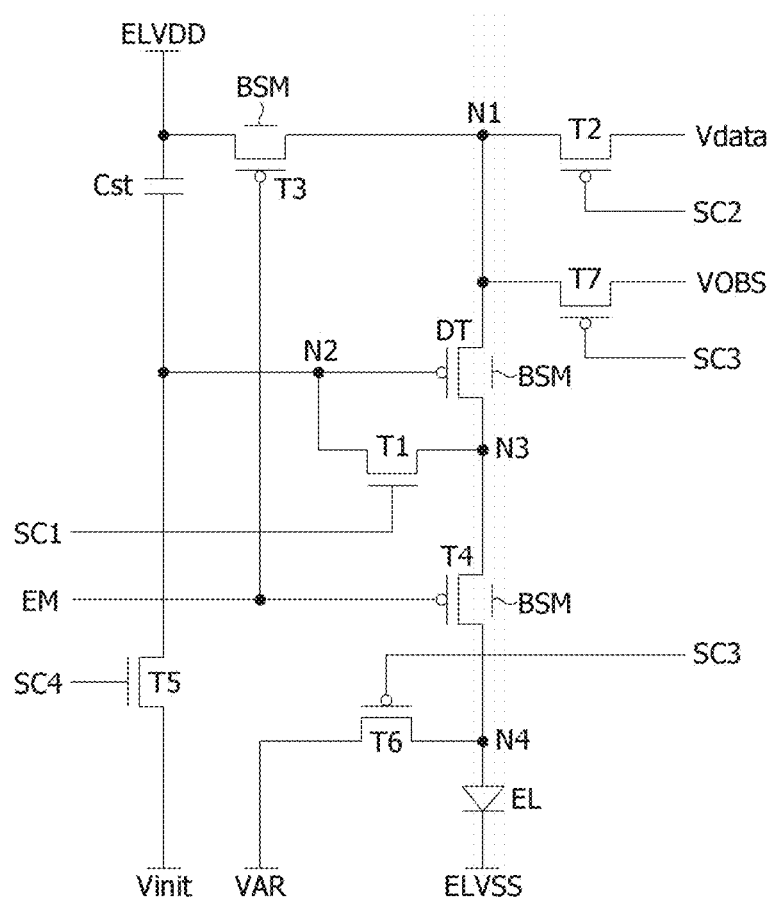
FIG. 11 is a circuit diagram illustrating a pixel circuit according to a third embodiment of the present disclosure.

FIG. 11 is a circuit diagram illustrating a pixel circuit according to a third embodiment of the present disclosure.

Referring to FIG. 11, the pixel circuit may include switching elements T1 and T5 that are implemented as an n-channel oxide TFT, and driving elements DT and switching elements T2, T3, T4, T6, T7 implemented as a p-channel LTPS TFT that are implemented as a p-channel oxide TFT.

In the pixel circuit, the shielding layer BSM may be disposed under the driving element DT, the third switching element T3, and the fourth switching element T4. When the shielding layer BSM is disposed in the transistors of the driving element DT, switching elements T3, and T4, the driving element DT, switching elements T3, and T4, which generate the driving current of the light-emitting element EL and are in the current path of the light-emitting element EL, are not exposed to infrared (IR), thus preventing the black luminance of the pixels from increasing.

The shielding layer BSM may not be applied to the first switching element T1, the second switching element T2, the fifth switching element T5, the sixth switching element T6, and the seventh switching element T7. Since there is no shielding layer BSM under the transistors of the switching elements T1, T2, T5, T6, and T7, transmittance of the display panel may be improved in the light emitting and receiving paths of the optical device 200.

The second switching element T2 transfers the data voltage Vdata to the first node N1 during the sampling period SAM, and is in the off-state during the light emission period EMI. Since the data voltage Vdata of the black grayscale is a maximum voltage in the dynamic range, even if a leakage current occurs in the second switching element T2, it may have a small effect on the gate-source voltage Vgs of the driving element DT. For example, since the first switching element (T1) is turned on before the sampling period (SAM) starts, the gate-to-source voltage Vgs of the driving element DT may be small when the data voltage Vdata of the black grayscale is transmitted to the second node through the second switching element (T2) during the sampling period (SAM). Accordingly, the second switching element T2 may have little effect on the black luminance of the pixel even without the shielding layer BSM.

The third switching element T3 is in the on-state during the emission period EMI. Accordingly, exposure of the third switching element T3 to infrared (IR) may increase the gate-source voltage Vgs of the driving element DT, thereby increasing the black luminance of the pixel. When the shielding layer BSM is applied to the third switching element T3, the third switching element T3 is not exposed to infrared (IR), thereby preventing the increase in the black luminance of the pixel due to the leakage current of the third switching element T3. For example, if the shielding layer BSM is further configured in the third switching element T3, the leakage current between the ELVDD and the first node N1 may be blocked. Since the shielding layer BSM is further configured in the third switching element T3 in addition to the fourth switching element T4, an increase in the black luminance of the pixel may be further prevented.

Figure 12:
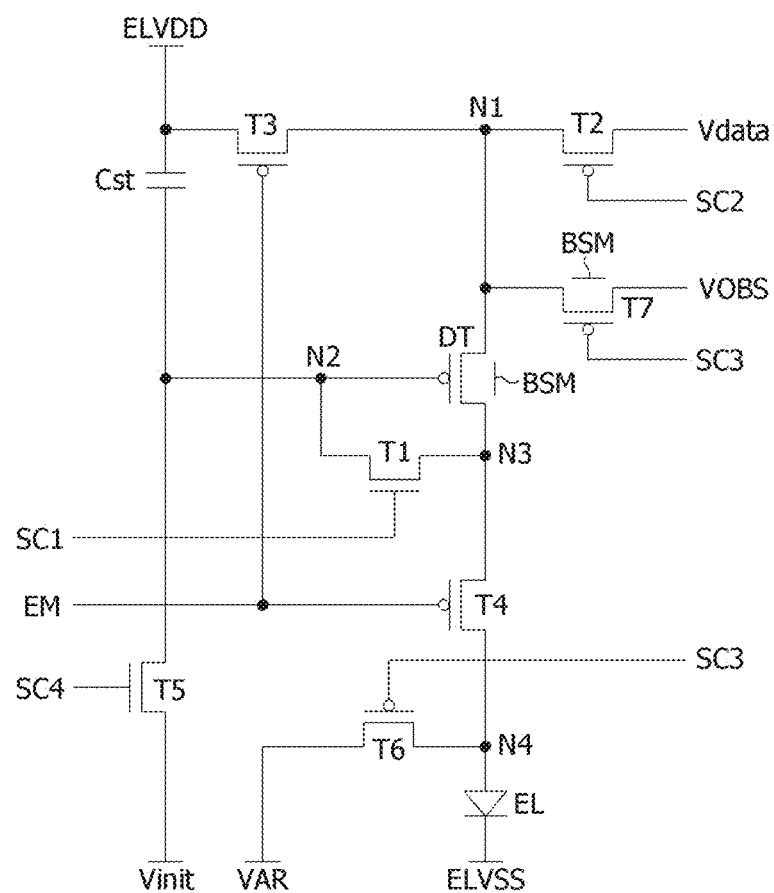
FIG. 12 is a circuit diagram illustrating a pixel circuit according to a fourth embodiment of the present disclosure.

FIG. 12 is a circuit diagram illustrating a pixel circuit according to a fourth embodiment of the present disclosure.

Referring to FIG. 12, the pixel circuit may include switching elements T1 and T5 that are implemented as an n-channel oxide TFT, and driving elements DT and switching elements T2, T3, T4, T6, and T7 implemented as a p-channel LTPS TFT that are implemented as a p-channel oxide TFT.

In the pixel circuit, the shielding layer BSM may be disposed under the driving element DT and the seventh switching element T7. When the shielding layer BSM is applied to the transistors DT and T7, the transistors DT and T7, which generate the driving current of the light-emitting element EL and are in the current path of the light-emitting element EL, are not exposed to infrared (IR), thereby preventing an increase in the black luminance of the pixels. The seventh switching element T7 may be implemented as an LTPS TFT that may generate a leakage current upon exposure to infrared (IR), and the second compensation voltage VOBS may increase the gate-source voltage Vgs of the driving element DT, whereby the amount of current flowing to the light-emitting element EL through the driving element DT upon exposure to infrared (IR) may be increased.

When the seventh switching element T7 is turned-on and the second compensation voltage VOBS is applied to the second node N2, the pixel driving voltage ELVDD and the second compensation voltage VOBS are applied together to the second node N2, resulting in a higher voltage being applied to the second node N2 compared to the normal operation. Thus, the gate-source voltage Vgs of the driving element DT increases, which causes the voltage of the fourth node N4 to increase, thereby increasing the luminance. For example, when the gate-source voltage Vgs of the driving element DT increases due to the second compensation voltage VOBS, the amount of current flowing to the light-emitting element EL may increase when the light-emitting element EL emits light, which may increase the luminance of the light-emitting element EL.

When the seventh switching element T7 in the off-state is exposed to the infrared (IR), the leakage current generated in the semiconductor layer of the seventh switching element T7 may increase the gate-source voltage Vgs of the driving element DT, which may increase the black luminance of the pixel. When the shielding layer BSM is disposed in the seventh switching element T7, the leakage current of the seventh switching element T7 may be reduced because the seventh switching element T7 is not exposed to infrared (IR). Accordingly, the shielding layer BSM in the seventh switching element T7 may prevent the leakage current of the seventh switching element T7 caused by the effect of infrared (IR), thereby preventing an increase in the black luminance of the pixel.

The shielding layer BSM may not be applied to the first switching element T1, the second switching element T2, the third switching element T3, the fourth switching element T4, the fifth switching element T5, and the sixth switching element T6. Since there is no shielding layer BSM under the switching transistors T1, T2, T3, T4, T5, and T6, transmittance of the display panel may be improved in the light emitting and receiving paths of the optical device 200.

Figure 13:
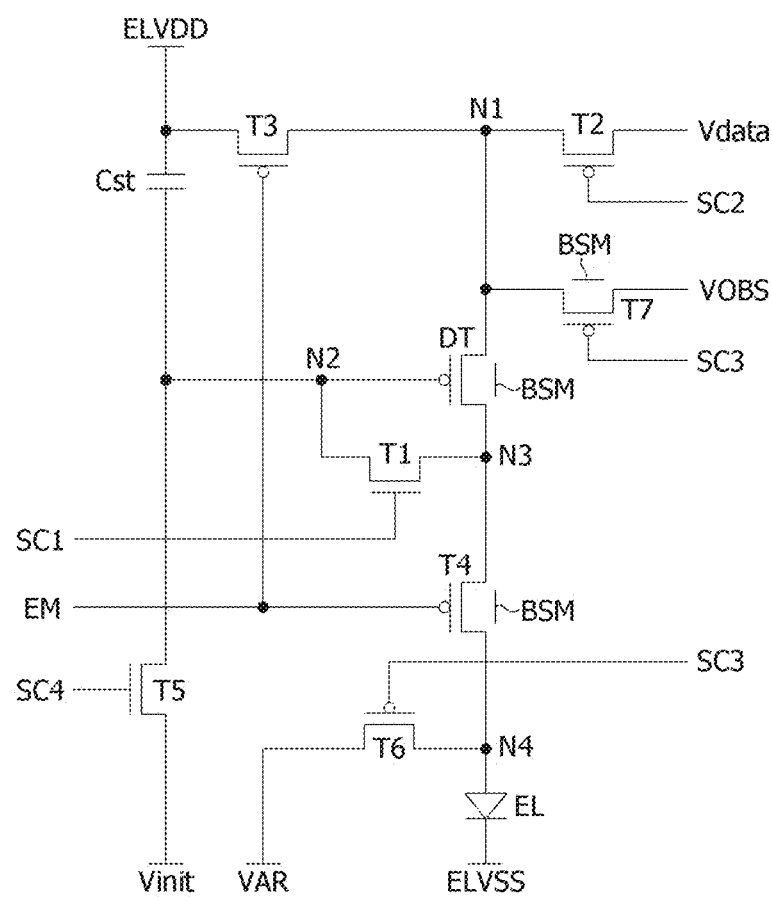
FIG. 13 is a circuit diagram illustrating a pixel circuit according to a fifth embodiment of the present disclosure.

FIG. 13 is a circuit diagram illustrating a pixel circuit according to a fifth embodiment of the present disclosure.

Referring to FIG. 13, the pixel circuit may include switching elements T1 and T5 that are implemented as an n-channel oxide TFT, and driving elements DT and switching elements T2, T3, T4, T6, T7 implemented as p-channel LTPS TFT that are implemented as a p-channel oxide TFT.

In the pixel circuit, the shielding layer BSM may be disposed under the driving element DT, the fourth switching element T4, and the seventh switching element T7. When the shielding layer BSM is configured in the transistors DT, T4, and T7, an increase in black luminance of the pixels may be prevented.

The shielding layer BSM may not be applied to the first switching element T1, the second switching element T2, the third switching element T3, the fifth switching element T5, and the sixth switching element T6. Since there is no shielding layer BSM under the transistors of the switching elements T1, T2, T3, T5, and T6, transmittance of the display panel may be improved in the light emitting and receiving paths of the optical device 200.

Figure 14:
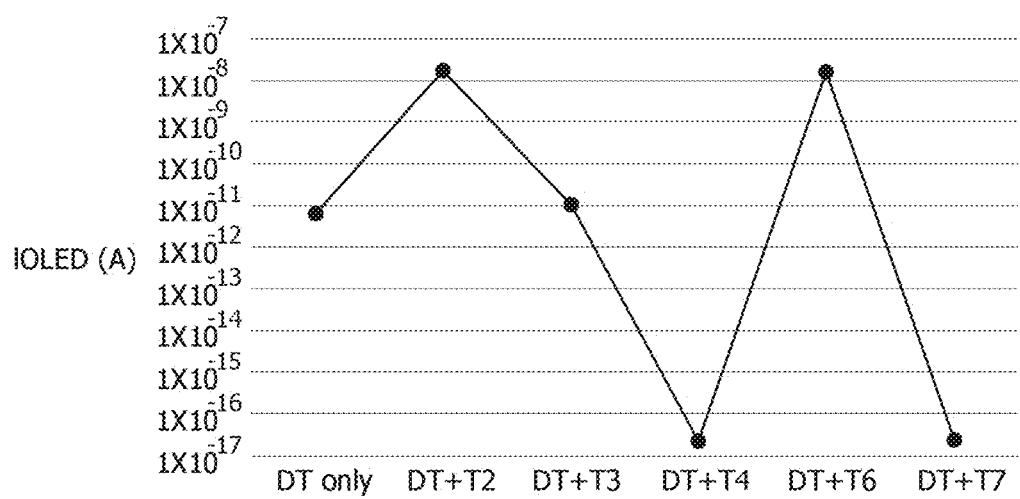
FIG. 14 illustrates an experimental result showing the amount of change in current of a light-emitting element in black luminance when a shielding layer is applied to p-channel TFTs constituting a pixel circuit according to one or more embodiments of the present disclosure.

FIG. 14 is a diagram of an experimental result showing the amount of change in current of the light-emitting element in black luminance when the shielding layer is applied to p-channel LTPS TFTs constituting the pixel circuit according to one or more embodiments of the present disclosure. In this experiment, the black luminance was measured when the pixel data of black grayscale values were written to the pixel circuits. In FIG. 14, a horizontal axis represents the transistors to which the shielding layer is applied to the p-channel LTPS TFTs that constitutes the pixel circuits. A vertical axis is the current of the corresponding light-emitting element EL (IOLED (A)) when the pixel data of the black gray scale is written to the pixel circuit.

Referring to FIG. 14, when the shielding layer BSM is applied only to the driving element DT or the shielding layer BSM is applied only to the driving element DT and the third switching element T3, the current flowing to the light-emitting element EL at the black grayscale is small. It is confirmed that the current flowing through the light-emitting element EL at the black grayscale is smaller when the shielding layer BSM is applied to the fourth switching element T4 or the seventh switching element T7 together with the driving element DT.

It is confirmed that the current flowing to the light-emitting element EL at the black grayscale is relatively high when the shielding layer BSM is applied to the second switching element T2 together with the driving element DT or the shielding layer BSM is applied to the sixth switching element T6 together with the driving element DT.

The pixel circuit may be implemented as the pixel circuit shown in FIGS. 10 to 13. Accordingly, the display panel according to embodiments of the present disclosure may secure transmittance to infrared (IR) and protect transistors vulnerable to infrared rays from infrared (IR).

Regardless of the distinction between the first and second pixel areas DA and CA, all pixels in the display area AA may be implemented by any one of the pixel circuits shown in FIGS. 10 to 13.

In another embodiment of the present disclosure, the pixels of the first pixel area DA may be implemented as the pixel circuit shown in FIG. 1 or a pixel circuit in which the shielding layer BSM is applied to all of the LTPS TFTs, for example, the driving element DT, and the switching elements T2, T3, T4, T6, and T7. All pixels in the second pixel area CA may be implemented as any one of the pixel circuits shown in FIGS. 10 to 13.

In another embodiment of the present disclosure, the pixel circuit shown in FIG. 10 or the pixel circuit shown in FIG. 11 may also be applied to the second pixel area CA. The pixels in the first pixel area DA may be implemented as one or more of the pixel circuit shown in FIG. 12 or 13.

According to one or more embodiments of the present disclosure, a display panel and a display apparatus including the same may be described as follows.

According to one or more embodiments of the present disclosure, a display panel may include a first pixel area including a first plurality of pixels, and a second pixel area including a second plurality of pixels. A pixel circuit for each of the first plurality of pixels and the second plurality of pixels may include a first plurality of transistors having an oxide semiconductor layer, and a second plurality of transistors having a polysilicon semiconductor layer. A shielding layer may be under a portion of the second plurality of transistors having the polysilicon semiconductor layer.

According to one or more embodiments of the present disclosure, a display apparatus may include a display panel having a first pixel area and a second pixel area and configured to display an image, and an optical device under the display panel, the optical device overlapping the second pixel area. A pixel circuit for each of pixels disposed in at least one of the first pixel area or the second pixel area may include a plurality of transistors having an oxide semiconductor layer, and a plurality of transistors having a polysilicon semiconductor layer. A shielding layer may be under a portion of the plurality transistors having the polysilicon semiconductor layer.

According to one or more embodiments of the present disclosure, the pixel circuit may further include a driving element including a first electrode connected to a first node, a gate electrode connected to a second node, and a second electrode connected to a third node; a light emitting element including an anode electrode connected to a fourth node and a cathode electrode, a cathode voltage applied to the cathode electrode; a first switching element connected between the second node and the third node; a second switching element connected between a data line and the first node, a data voltage applied to the data line; a third switching element connected between a fifth node and the first node, a pixel driving voltage applied to the fifth node; a fourth switching element connected between the third node and the fourth node; and a fifth switching element connected between the second node and a sixth node, an initialization voltage applied to the sixth node. The first switching element and the fifth switching element may include a transistor of the plurality of transistors having the oxide semiconductor layer. The driving element, the second switching element, the third switching element, and the fourth switching element may include a transistor of the plurality of transistors having the polysilicon semiconductor layer.

According to one or more embodiments of the present disclosure, the shielding layer may be under the driving element and the fourth switching element.

According to one or more embodiments of the present disclosure, the shielding layer may be under the driving element, the third switching element, and the fourth switching element.

According to one or more embodiments of the present disclosure, in the second plurality of pixels, the shielding layer may be under the driving element and the fourth switching element, or may be under the driving element, the third switching element, and the fourth switching element.

According to one or more embodiments of the present disclosure, the pixel circuit may further include a sixth switching element between the fourth node and a seventh node, a first compensation voltage applied to the seventh node, and a seventh switching element between the first node and an eighth node, a second compensation voltage applied to the eighth node.

According to one or more embodiments of the present disclosure, the shielding layer may be under the driving element and the seventh switching element.

According to one or more embodiments of the present disclosure, the shielding layer may be under the driving element, the fourth switching element, and the seventh switching element.

According to one or more embodiments of the present disclosure, in the second plurality of pixels, the shielding layer may be under the driving element and the seventh switching element, or may be under the driving element, the fourth switching element, and the seventh switching element.

According to one or more embodiments of the present disclosure, in the first plurality of pixels, the shielding layer may be under all transistors including driving element, the first switching element, the second switching element, the third switching element, the fourth switching element, and the fifth switching element.

According to one or more embodiments of the present disclosure, the shielding layer may be in a subset of the first plurality of pixels and a subset of the second plurality of pixels.

According to one or more embodiments of the present disclosure, the shielding layer may be configured to receive a constant voltage.

According to one or more embodiments of the present disclosure, the display apparatus may be applied to mobile apparatuses, video phones, smart watches, watch phones, wearable apparatus, foldable apparatus, rollable apparatus, bendable apparatus, flexible apparatus, curved apparatus, sliding apparatus, variable apparatus, electronic organizer, electronic books, portable multimedia players (PMPs), personal digital assistants (PDAs), MP3 players, mobile medical apparatuses, desktop PCs, laptop PCs, netbook computers, workstations, navigations, vehicle navigations, vehicle display apparatuses, vehicle apparatuses, theater apparatuses, theater display apparatuses, televisions, wallpaper apparatuses, signage apparatuses, game apparatuses, laptops, monitors, cameras, camcorders, and home appliances, etc. Additionally, the display apparatus according to one or more embodiments of the present disclosure may be applied to organic light emitting lighting apparatuses or inorganic light emitting lighting apparatuses.

It will be apparent to those skilled in the art that various modifications and variations can be made in the present disclosure without departing from the scope of the disclosure. Thus, it is intended that the present disclosure covers the modifications and variations of this disclosure that within the scope of the claims and their equivalents.

What is claimed is:

1. A display panel, comprising:
   a first pixel area including a first plurality of pixels; and
   a second pixel area including a second plurality of pixels,
   wherein a pixel circuit for each of the first plurality of pixels and the second plurality of pixels includes:
      a first plurality of transistors having an oxide semiconductor layer;
      a second plurality of transistors having a polysilicon semiconductor layer;
      a driving element including a first electrode connected to a first node, a gate electrode connected to a second node, and a second electrode connected to a third node;
      a light emitting element including an anode electrode connected to a fourth node and a cathode electrode, a cathode voltage applied to the cathode electrode;
      a first switching element connected between the second node and the third node;
      a second switching element connected between a data line and the first node, a data voltage applied to the data line;
      a third switching element connected between a fifth node and the first node, a pixel driving voltage applied to the fifth node;
      a fourth switching element connected between the third node and the fourth node; and
      a fifth switching element connected between the second node and a sixth node, an initialization voltage applied to the sixth node,
   wherein the first switching element and the fifth switching element include a transistor of the first plurality of transistors having the oxide semiconductor layer,
   wherein each of the driving element, the second switching element, the third switching element, and the fourth switching element includes a transistor of the second plurality of transistors having the polysilicon semiconductor layer, and
   wherein a shielding layer is under a portion of the second plurality of transistors having the polysilicon semiconductor layer.

2. The display panel of claim 1, wherein the shielding layer is under the driving element and the fourth switching element.

3. The display panel of claim 1, wherein the shielding layer is under the driving element, the third switching element, and the fourth switching element.

4. The display panel of claim 1, wherein the pixel circuit further includes:
   a sixth switching element between the fourth node and a seventh node, a first compensation voltage applied to the seventh node; and
   a seventh switching element between the first node and an eight node, a second compensation voltage applied to the eight node.

5. The display panel of claim 4, wherein the shielding layer is under the driving element and the seventh switching element.

6. The display panel of claim 4, wherein the shielding layer is under the driving element, the fourth switching element, and the seventh switching element.

7. The display panel of claim 1, wherein the shielding layer receives a constant voltage.

8. A display apparatus, comprising:
   a display panel having a first pixel area with a first plurality of pixels and a second pixel area with a second plurality of pixels, the display panel configured to display an image; and
   an optical device under the display panel, the optical device overlapping the second pixel area,
   wherein a pixel circuit for each pixel of at least one of the first plurality of pixels or the second plurality of pixels includes:
      a first plurality of transistors having an oxide semiconductor layer; and a second plurality of transistors having a polysilicon semiconductor layer;

a driving element including a first electrode connected to a first node, a gate electrode connected to a second node, and a second electrode connected to a third node;

a light emitting element including an anode electrode connected to a fourth node and a cathode electrode, a cathode voltage applied to the cathode electrode;

a first switching element connected between the second node and the third node;

a second switching element connected between a data line and the first node, a data voltage applied to the data line;

a third switching element connected between a fifth node and the first node, a pixel driving voltage applied to the fifth node;

a fourth switching element connected between the third node and the fourth node; and a fifth switching element between the second node and a sixth node, an initialization voltage applied to the sixth node, wherein the first switching element and the fifth switching element include a transistor of the first plurality of transistors having the oxide semiconductor layer, wherein each of the driving element, the second switching element, the third switching element, and the fourth switching element includes a transistor of the second plurality of transistors having the polysilicon semiconductor layer, and wherein a shielding layer is under a portion of the second plurality of transistors having the polysilicon semiconductor layer.

9. The display apparatus of claim 8, wherein the shielding layer is under the driving element and the fourth switching element.

10. The display apparatus of claim 9, wherein in the second plurality of pixels, the shielding layer is:

under the driving element and the fourth switching element, or under the driving element, the third switching element, and the fourth switching element.

11. The display apparatus of claim 9, wherein in the first plurality of pixels, the shielding layer is under all of transistors including the driving element, the first switching element, the second switching element, the third switching element, the fourth switching element, and the fifth switching element.

12. The display apparatus of claim 9, wherein the shielding layer is in a subset of the first plurality of pixels and a subset of the second plurality of pixels.

13. The display apparatus of claim 8, wherein the shielding layer is under the driving element, the third switching element, and the fourth switching element.

14. The display apparatus of claim 8, wherein the pixel circuit further includes:

a sixth switching element between the fourth node and a seventh node, a first compensation voltage applied to the seventh node; and a seventh switching element between the first node and an eighth node, a second compensation voltage applied to the eighth node.

15. The display apparatus of claim 14, wherein the shielding layer is under the driving element and the seventh switching element.

16. The display apparatus of claim 15, wherein in the second plurality of pixels, the shielding layer is:

under the driving element and the seventh switching element, or under the driving element, the fourth switching element, and the seventh switching element.

17. The display apparatus of claim 14, wherein the shielding layer is under the driving element, the fourth switching element, and the seventh switching element.

18. The display apparatus of claim 8, wherein the shielding layer receives a constant voltage.

* * * * *